United States Patent
Okuno

(10) Patent No.: US 9,765,941 B2
(45) Date of Patent: Sep. 19, 2017

(54) OPTICAL FILM, SURFACE LIGHT EMITTING BODY, AND METHOD FOR PRODUCING OPTICAL FILM

(71) Applicant: Mitsubishi Rayon Co., Ltd., Tokyo (JP)

(72) Inventor: Daichi Okuno, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 337 days.

(21) Appl. No.: 14/359,376

(22) PCT Filed: Nov. 14, 2012

(86) PCT No.: PCT/JP2012/079489
§ 371 (c)(1),
(2) Date: May 20, 2014

(87) PCT Pub. No.: WO2013/080794
PCT Pub. Date: Jun. 6, 2013

(65) Prior Publication Data
US 2015/0085496 A1     Mar. 26, 2015

(30) Foreign Application Priority Data

Nov. 29, 2011  (JP) .................................. 2011-260296
Apr. 11, 2012  (JP) .................................. 2012-089957
(Continued)

(51) Int. Cl.
*B29D 11/00*        (2006.01)
*F21V 5/00*         (2015.01)
(Continued)

(52) U.S. Cl.
CPC ............. *F21V 5/004* (2013.01); *B29C 41/003* (2013.01); *B29C 41/26* (2013.01); *B29C 41/32* (2013.01);
(Continued)

(58) Field of Classification Search
CPC ........ B29D 11/00355; B29D 11/00365; B29D 11/00788; B29C 41/003; B29C 41/26; B29C 41/32
See application file for complete search history.

(56) References Cited

U.S. PATENT DOCUMENTS

2001/0048968 A1*  12/2001  Cox .......................... B41J 2/01
                                                          427/162

FOREIGN PATENT DOCUMENTS

| JP | 10-111537 A   | 4/1998 |
| JP | 2007-133196 A | 5/2007 |

(Continued)

OTHER PUBLICATIONS

International Search Report issued in corresponding International Patent Application No. PCT/JP2012/079489 dated Feb. 19, 2013.

Primary Examiner — Mathieu Vargot
(74) Attorney, Agent, or Firm — Morgan, Lewis & Bockius LLP

(57) ABSTRACT

An optical film has a plurality of aligned convex microlenses, each of which has a region α and a region β, region β forming the outer part of the convex shape of the microlens and positioned so as to cover region α. Both region α and region β contain a resin, and the refractive index of the resin in region α is higher than the refractive index of the resin in region β; region β contains fine particles, and region α contains fine particles, and the content of the fine particles contained in region α is lower than the content of the fine particles contained in region β; or region α contains fine
(Continued)

particles, and region β contains fine particles, and the content of the fine particles contained in region α is higher than the content of the fine particles contained in region β.

2 Claims, 9 Drawing Sheets

(30) Foreign Application Priority Data

| Apr. 11, 2012 | (JP) | ................................ 2012-090491 |
| May 16, 2012 | (JP) | ................................ 2012-112300 |
| Jul. 4, 2012 | (JP) | ................................ 2012-150405 |

(51) Int. Cl.

| G02B 3/00 | (2006.01) |
|---|---|
| G02B 5/02 | (2006.01) |
| B29C 41/00 | (2006.01) |
| B29C 41/26 | (2006.01) |
| B29C 41/32 | (2006.01) |
| G02B 1/04 | (2006.01) |
| H01L 51/52 | (2006.01) |
| B29K 25/00 | (2006.01) |
| B29K 33/00 | (2006.01) |
| B29K 35/00 | (2006.01) |
| B29K 83/00 | (2006.01) |
| B29K 105/24 | (2006.01) |
| B29L 11/00 | (2006.01) |

(52) U.S. Cl.
CPC .. *B29D 11/00355* (2013.01); *B29D 11/00365* (2013.01); *B29D 11/00788* (2013.01); *G02B 1/041* (2013.01); *G02B 3/0043* (2013.01); *G02B 3/0056* (2013.01); *G02B 5/021* (2013.01); *G02B 5/0278* (2013.01); *B29K 2025/04* (2013.01); *B29K 2033/08* (2013.01); *B29K 2035/00* (2013.01); *B29K 2083/00* (2013.01); *B29K 2105/246* (2013.01); *B29L 2011/0016* (2013.01); *G02B 2207/113* (2013.01); *H01L 51/5275* (2013.01)

(56) References Cited

FOREIGN PATENT DOCUMENTS

| JP | 2008-058494 A | | 3/2008 |
| JP | 2008-305590 A | | 12/2008 |
| JP | 2010-250357 | * | 11/2010 |
| JP | 2011-159632 A | | 8/2011 |
| WO | 2008/093819 A1 | | 8/2008 |

* cited by examiner and a refractive index $n_1$ of the resin in the region alpha is higher than a refractive index $n_2$ of the resin in the region beta.

OPTICAL FILM, SURFACE LIGHT EMITTING BODY, AND METHOD FOR PRODUCING OPTICAL FILM

TECHNICAL FIELD

The present invention relates to an optical film, a surface light emitter, and a method for producing an optical film.

This application claims the benefit of priority from Japanese Patent Application No. 2011-260296 filed on Nov. 29, 2011, Japanese Patent Application No. 2012-089957 filed on Apr. 11, 2012, Japanese Patent Application No. 2012-090491 filed on Apr. 11, 2012, Japanese Patent Application No. 2012-112300 filed on May 16, 2012, and Japanese Patent Application No. 2012-150405 filed on Jul. 4, 2012, the contents of which are incorporated herein by reference.

BACKGROUND ART

Among surface light emitters, an organic EL (electroluminescence) light emitting device is expected to be used in a flat panel display or in a new generation lighting device that is used in place of a fluorescent bulb and the like.

The organic EL light emitting device has various structures including a simple structure in which an organic thin film, which is a light emitting layer, is simply sandwiched by two films and a multi layered structure. As the multi layered structure, a structure in which a hole transporting layer, a light emitting layer, an electron transporting layer, and a cathode are layered on an anode provided on a glass substrate can be exemplified. The layers that are interposed between the anode and the cathode are all composed of organic thin films and a thickness of each organic thin film is as thin as several dozen nm.

The organic EL light emitting device is a layered body of thin films and a total reflection angle of light between the thin films is determined by difference of refractive index between materials of the thin films. Currently, approximately 80% of light generated in the light emitting layer is confined in the organic EL light emitting device and cannot be extracted therefrom. More specifically, given the refractive index of the glass substrate being 1.5 and the refractive index of an air layer being 1.0, a critical angle $\theta_c$ is 41.8°, and light with an incidence angle smaller than the critical angle $\theta_c$ is output to the air layer while light with an incidence angle greater than the critical angle $\theta_c$ is totally reflected and confined in the glass substrate. For this reason, extraction of the light confined inside the glass substrate on a surface of the organic EL light emitting device to the outside of the glass substrate, in other words improvement of light extraction efficiency and normal brightness, is desired.

Meanwhile, for the organic EL light emitting device that emits light isotropically, in addition to improvement of light extraction efficiency and normal brightness, an output light wavelength from the organic EL light emitting device with low dependence on an output angle is desired. That is, upon output of light from the light emitting layer through the glass substrate, it is desired that a difference in output angle between wavelengths is small, in other words, it is desired that wavelength dependence is as small as possible with regard to distribution of output light from the glass substrate.

In addition, providing an optical film on an output surface of the organic EL light emitting device is known as a method for solving the above described problem; however, since the optical film is provided in an outermost layer, flaw resistance is desired.

Patent Document 1 proposes an optical film having a microlens covered by an outer layer composed of a deposited material with a low refractive index, in order to improve brightness of a surface light emitter. Patent Document 2 proposes an optical film having a lens portion containing fine particles in order to maintain uniformity of brightness of a surface light emitter.

Patent Document 1: Japanese Unexamined Patent Application, Publication No. 2011-123204

Patent Document 2: Japanese Unexamined Patent Application, Publication No. 2009-25774

DISCLOSURE OF THE INVENTION

Problems to be Solved by the Invention

However, in the optical film proposed in Patent Document 1, a material for the outer layer is limited to depositable materials, and it is difficult to control a shape of the lens and thickness of the outer layer, reducing light extraction efficiency. In the optical film proposed in Patent Document 2, although dependence of the output light wavelength from the surface light emitter on an output angle is lowered by including fine particles, it is difficult to localize the fine particles in an intended area in the lens portion and it is difficult to improve simultaneously the light extraction efficiency and the output angle dependence of the output light wavelength of the surface light emitter.

An objective of the present invention is to provide an optical film that is superior in improving light extraction efficiency of a surface light emitter, superior in suppressing the output angle dependence of the output light wavelength of the surface light emitter, or superior in flaw resistance.

Another objective of the present invention is to provide a surface light emitter that is superior in light extraction efficiency, or superior in suppressing the output angle dependence of the output light wavelength.

Yet another objective of the present invention is to provide a preferable method for producing an optical film that is superior in improving light extraction efficiency of a surface light emitter, superior in suppressing the output angle dependence of the output light wavelength of the surface light emitter, or superior in flaw resistance.

Means for Solving the Problems

According to the present invention, for accomplishing any of the above described objectives, provided is an optical film that is provided with a plurality of aligned convex microlenses, in which:

the microlenses have a region alpha and a region beta;

the region beta forms an outer part of the convex shape of the microlenses and positioned so as to cover the region alpha;

both the region alpha and the region beta contain a resin; and a refractive index $n_1$ of the resin in the region alpha is higher than a refractive index $n_2$ of the resin in the region beta.

In addition, according to the present invention, for accomplishing any of the above described objectives, provided is an optical film that is provided with a plurality of aligned convex microlenses, in which:

the microlenses have a region alpha and a region beta;

the region beta forms an outer part of the convex shape of the microlenses and positioned so as to cover the region alpha;

the region beta contains fine particles;

the region alpha contains fine particles as necessary; and the content $P_1$ of the fine particles in the region alpha is lower than the content $P_2$ of the fine particles in the region beta.

In addition, according to the present invention, for accomplishing any of the above described objectives, provided is an optical film that is provided with a plurality of aligned convex microlenses, in which:

the microlenses have a region alpha and a region beta;

the region beta forms an outer part of the convex shape of the microlenses and positioned so as to cover the region alpha;

the region alpha contains fine particles;

the region beta contains fine particles as necessary; and the content $P_1$ of the fine particles in the region alpha is higher than the content $P_2$ of the fine particles in the region beta.

In addition, according to the present invention, for accomplishing any of the above described objectives, provided is a surface light emitter including any one of the above optical films.

Furthermore, according to the present invention, for accomplishing any of the above described objectives, provided is a method for producing an optical film provided with a plurality of aligned convex microlenses including the following steps A to D that are sequentially performed:

step A: a step of rotating a roll mold having an outer peripheral surface provided with a plurality of aligned concave microlens transfer units, applying an active energy ray curing composition B onto the outer peripheral surface of the roll mold while making a base material travel in a rotational direction of the roll mold along the outer peripheral surface of the roll mold, and filling a part of a concave shape of the microlens transfer units with the active energy ray curing composition B;

step B: a step of providing an active energy ray curing composition A to between the outer peripheral surface of the roll mold and the base material;

step C: a step of irradiating a region between the outer peripheral surface of the roll mold and the base material with an active energy ray, in a state in which the active energy ray curing composition A is interposed between the outer peripheral surface of the roll mold and the base material; and step D: a step of separating a cured product obtained in the step C from the roll mold.

Effects of the Invention

The optical film of the present invention is superior in improving light extraction efficiency of a surface light emitter, superior in suppressing the output angle dependence of the output light wavelength of the surface light emitter, or superior in flaw resistance.

The surface light emitter including the optical film of the present invention is superior in light extraction efficiency, or superior in suppressing the output angle dependence of the output light wavelength.

According to the method for producing an optical film of the present invention, an optical film that is superior in improving light extraction efficiency of a surface light emitter, superior in suppressing the output angle dependence of the output light wavelength of the surface light emitter, or superior in flaw resistance can be obtained.

PREFERRED MODE FOR CARRYING OUT THE INVENTION

The embodiments of the present invention are explained hereinafter with reference to the drawings; however, the present invention is not limited to these drawings and embodiments.

(Convex Shape of Microlens)

The optical film of the present invention is provided with a plurality of aligned convex microlenses.

Figure 1:
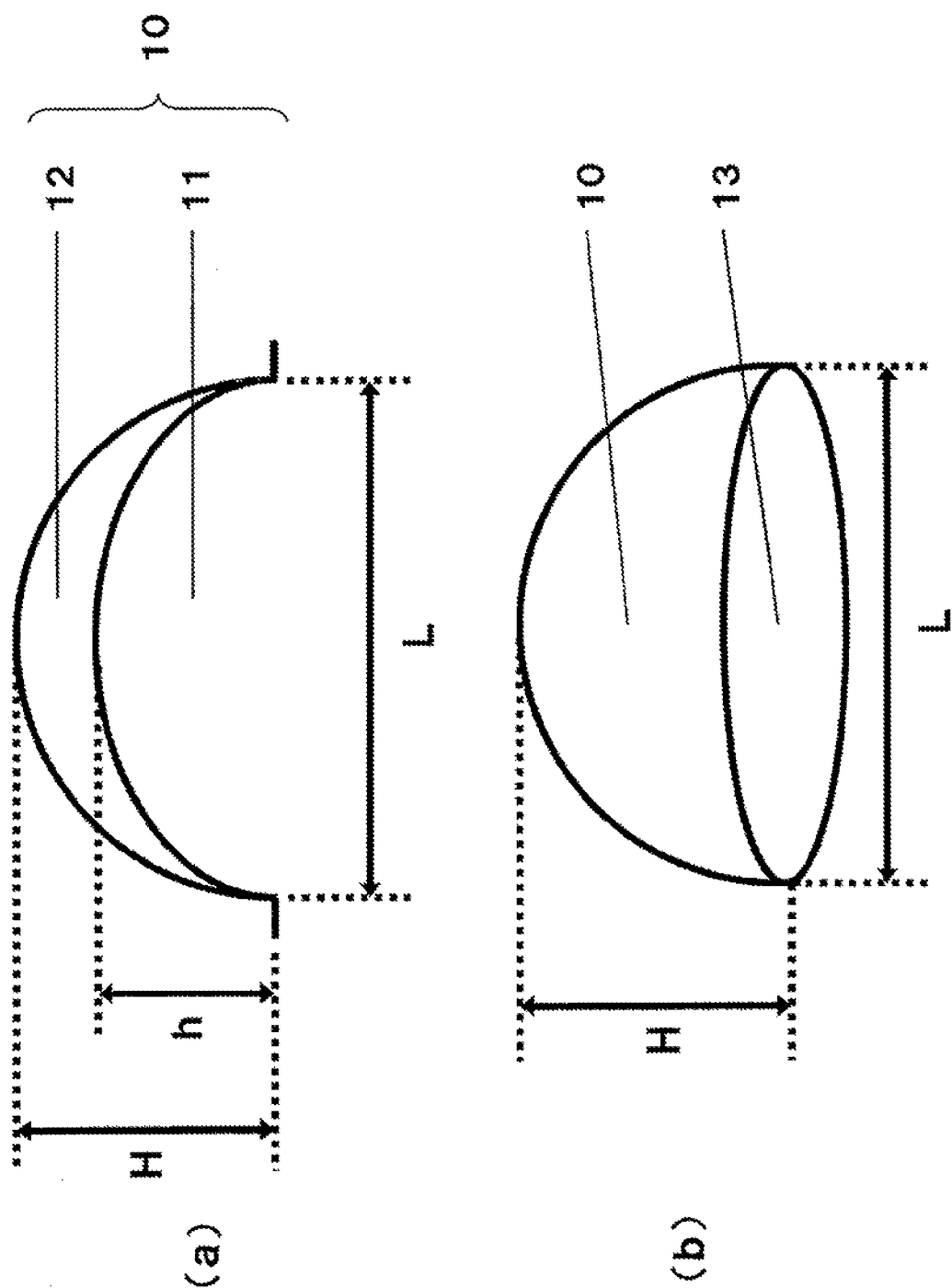
FIG. 1(a) is a schematic cross-sectional view and FIG. 1(b) is a schematic perspective view showing an example of a convex microlens in an optical film of the present invention.

An example of a convex microlens is shown in FIG. 1. In FIG. 1, (a) is a schematic cross-sectional view and (b) is a schematic perspective view. The microlens 10 includes a region alpha indicated by a reference numeral 11 and a region beta indicated by a reference numeral 12. The region beta (12) forms an outer part of the convex shape of the microlens 10. The region beta (12) is positioned so as to cover the region alpha (11). The region beta (12) can either cover the region alpha (11) or cover the region alpha (11) such that a part thereof is exposed to the outside. From the viewpoint of fully providing a function of the region beta in the optical film, it is preferable to cover the region alpha by the region beta as much as possible. In FIG. 1, a reference numeral 13 indicates a bottom surface portion of the microlens 10.

In the present Specification, the bottom surface portion 13 of the microlens is a virtual planar part surrounded by an outer peripheral edge of a bottom portion of the microlens. In a case in which the optical film has a buffer layer (described later), the bottom surface portion of the microlens corresponds to an interface between the microlens and the buffer layer.

In addition, in the present Specification, a maximum diameter L of the bottom surface portion 13 of the microlens indicates a length of the longest part of the bottom surface portion of the microlens; and an average maximum diameter $L_{ave}$ of the bottom surface portion of the microlens is obtained by: taking an image of a surface of the optical film with microlenses by a scanning microscope; measuring the maximum diameter L of the bottom surface portion of the microlens at 5 positions, and averaging the values measured.

In addition, in the present Specification, a height H of the microlens indicates a height from the bottom surface portion of the microlens to a highest part of the microlens; and an average height $H_{ave}$ is obtained by: taking an image of a cross-section of the optical film by a scanning microscope; measuring the height H of the microlens at 5 positions, and averaging the values measured.

Furthermore, in the present Specification, a height h of the region alpha indicates a height from the bottom surface portion of the microlens to a highest part of the region alpha; and an average height $h_{ave}$ is obtained by: taking an image of a cross-section of the optical film by a scanning microscope; measuring the height h of the microlens at 5 positions, and averaging the values measured.

The convex shape of the microlens includes, for example: a spherical segment shape, a spherical segment trapezoidal shape, an ellipsoid spherical segment shape (a shape obtained by cutting a spheroid with one plane), an ellipsoid spherical segment trapezoidal shape (a shape obtained by cutting a spheroid with two planes that are parallel to each other), a pyramid shape, a pyramid trapezoidal shape, a conical shape, a conical trapezoidal shape, roof-like shapes relating to these shapes (a spherical segment shape, a spherical segment trapezoidal shape, an ellipsoid spherical segment shape, an ellipsoid spherical segment trapezoidal shape, a pyramid shape, a pyramid trapezoidal shape, a conical shape, or a conical trapezoidal shape being extended along a bottom surface portion) and the like. These convex shapes of the microlens can be used singly or in combination of two or more for a plurality of microlenses. Among these convex shapes of the microlens, a spherical segment shape, a spherical segment trapezoidal shape, an ellipsoid spherical segment shape, and an ellipsoid spherical segment trapezoidal shape that are superior in light extraction efficiency of a surface light emitter are preferable, and a spherical segment shape and an ellipsoid spherical segment shape are more preferable.

An average maximum diameter $L_{ave}$ of the bottom surface portion of the microlens is preferably 2 to 400 μm, more preferably 10 to 200 μm, and further more preferably 20 to 100 μm. The average maximum diameter $L_{ave}$ of the bottom surface portion of the microlens of at least 2 μm can provide superior light extraction efficiency to a surface light emitter. The average maximum diameter $L_{ave}$ of the bottom surface portion of the microlens of no greater than 400 μm can prevent the microlenses from being visually recognized and provide superior appearance to the optical film.

An average height $H_{ave}$ of the microlens is preferably 1 to 200 μm, more preferably 5 to 100 μm, and further more preferably 10 to 50 μm. The average height $H_{ave}$ of the microlens of at least 1 μm can provide superior light extraction efficiency to a surface light emitter. The average height $H_{ave}$ of the microlens of no greater than 200 μm can provide superior softness to the optical film.

An aspect ratio of the microlens is preferably 0.3 to 1.4, more preferably 0.35 to 1.3, and further more preferably 0.4 to 1.0. The aspect ratio of the microlens of at least 0.3 can provide superior light extraction efficiency and superior normal brightness to a surface light emitter. The aspect ratio of the microlens of no greater than 1.4 allows easy formation of the transfer unit on the roll mold, thereby facilitating production of the optical film.

It should be noted that the aspect ratio of the microlens is calculated as follows: the average height $H_{ave}$ of the microlens/the average maximum diameter $L_{ave}$.

(Bottom Surface Portion of Microlens)

The shape of the bottom surface portion of the microlens includes, for example, a circular shape, an oval shape, and the like. These shapes of the bottom surface portion of the microlens can be used singly or in combination of two or more for a plurality of microlenses. Among these shapes of the bottom surface portion of the microlens, a circular shape and an oval shape that are superior in light extraction efficiency of a surface light emitter are preferable, and a circular shape is more preferable.

Figure 2:
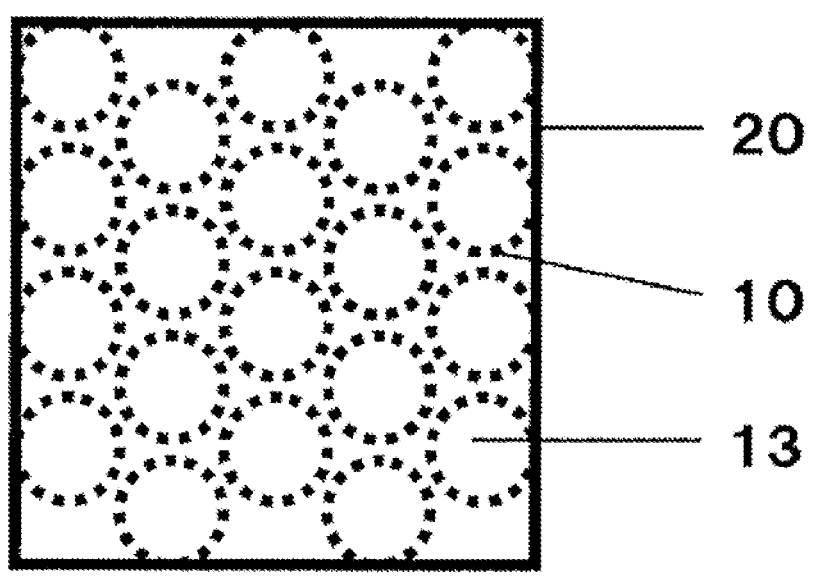
FIG. 2 is a schematic view of an example of the optical film of the present invention viewed from an upper side of the optical film.

An example of the optical film viewed from an upper side thereof is shown in FIG. 2. A ratio of a total area of the bottom surface portions 13 of the microlenses 10 (areas surrounded by dotted lines in FIG. 2) to an area of the optical film 20 (an area surrounded by solid line in FIG. 2) is preferably 20 to 99%, more preferably 30 to 95%, and further more preferably 50 to 93%. The ratio of a total area of the bottom surface portions of the microlenses to an area of the optical film of at least 20% can provide superior light extraction efficiency to a surface light emitter. The ratio of a total area of the bottom surface portions of the microlenses to an area of the optical film of no greater than 99% allows easy formation of the transfer unit on the roll mold, thereby facilitating production of the optical film.

It should be noted that, in a case in which the bottom surface portions of the microlenses are all circular shapes of the same size, the maximum value for the ratio of a total area of the bottom surface portions of the microlenses to an area of the optical film is approximately 91%.

(Alignment of Microlenses)

Figure 3:
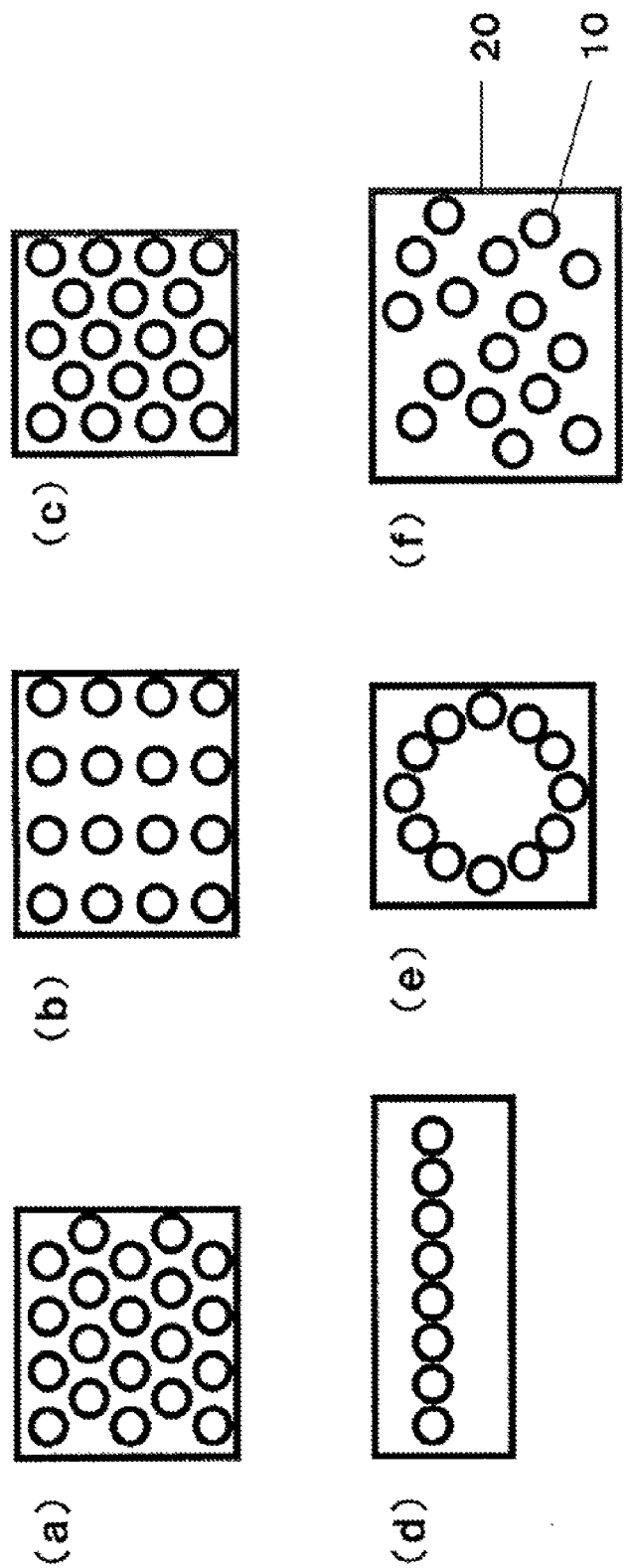
FIG. 3(a) is an hexagonal alignment.
FIG. 3(b) is a rectangular alignment.
FIG. 3(c) is a diamond alignment.
FIG. 3(d) is a linear alignment.
FIG. 3(e) is a circular alignment.
FIG. 3(f) is a random alignment; each of which is a schematic view of an example of alignment of the microlenses in the optical film of the present invention, viewed from an upper side of the optical film.

An example of alignment of microlenses is shown in FIG. 3.

The alignment of microlenses includes, for example: hexagonal alignment (FIG. 3(a)); rectangular alignment (FIG. 3(b)); diamond alignment (FIG. 3(c)); linear alignment (FIG. 3(d)); circular alignment (FIG. 3(e)); random alignment (FIG. 3(f)) and the like. Among these examples of alignment of microlenses, hexagonal alignment, rectangular alignment, and diamond alignment that are superior in light extraction efficiency of a surface light emitter are preferable, and hexagonal alignment and rectangular alignment are more preferable.

(Region Alpha and Region Beta)

An average height $h_{ave}$ of the region alpha is preferably 0.8 to 160 μm, more preferably 4 to 80 μm, and further more preferably 8 to 40 μm. The average height $h_{ave}$ of the region alpha of at least 0.8 μm can provide superior light extraction efficiency and superior normal brightness to a surface light emitter. The average height $h_{ave}$ of the region alpha of no greater than 160 μm can provide superior suppression of output angle dependence of the output light wavelength of a surface light emitter.

A ratio of the average height $h_{ave}$ of the region alpha to the average height $H_{ave}$ of the microlenses ($h_{ave}/H_{ave}$) is preferably 0.04 to 0.96, more preferably 0.1 to 0.92, and further more preferably 0.2 to 0.88. The ratio of the average height $h_{ave}$ of the region alpha to the average height $H_{ave}$ of the microlenses of at least 0.04 can provide superior light extraction efficiency and superior normal brightness to a surface light emitter. The ratio of the average height $h_{ave}$ of the region alpha to the average height $H_{ave}$ of the microlenses of no greater than 0.96 can provide superior suppression of output angle dependence of the output light wavelength of a surface light emitter.

A ratio of the volume of the region alpha to the volume of the microlens is preferably 0.01 to 0.90, more preferably 0.02 to 0.80, and further more preferably 0.03 to 0.70. The ratio of the volume of the region alpha to the volume of the microlens of at least 0.01 can provide superior light extraction efficiency to a surface light emitter. The ratio of the volume of the region alpha to the volume of the microlens of no greater than 0.90 can provide superior suppression of output angle dependence of the output light wavelength of a surface light emitter.

The microlens can have another region present between the region alpha and the region beta. The "another region" can be composed of either a single layer or a plurality of layers. As the "another region", an intermediate region, which has a refractive index between the refractive index of the resin in the region alpha and the refractive index of the resin in the region beta, can be exemplified. By providing such an intermediate region, Fresnel reflection loss can further be reduced, thereby providing a surface light emitter of more superior light extraction efficiency.

(First Embodiment of Optical Film)

A first embodiment of the optical film of the present invention is an optical film in which: both the region alpha and the region beta contain a resin; and a refractive index $n_1$ of the resin in the region alpha is higher than a refractive index $n_2$ of the resin in the region beta.

The optical film of the first embodiment is particularly superior in light extraction efficiency of a surface light emitter.

In the optical film of the first embodiment, the refractive index $n_1$ of the resin in the region alpha is only required to be higher than a refractive index $n_2$ of the resin in the region beta, preferably 1.45 to 1.75, more preferably 1.50 to 1.70, and further more preferably 1.55 to 1.65. The refractive index $n_1$ of the resin in the region alpha of at least 1.45 can provide superior light extraction efficiency and superior normal brightness to a surface light emitter. In addition, the refractive index $n_1$ of the resin in the region alpha of no greater than 1.75 increases a degree of freedom in selection of resin.

It should be noted that the refractive index of a film in the present application is a value measured by using a prism coupler under a condition of 20° C., with He—Ne laser as a light source. For a resin or the like that is not in a film shape, the refractive index thereof is measured by the above specified method after shaping the resin into a film.

In the optical film of the first embodiment, the refractive index $n_2$ of the resin in the region beta is only required to be lower than the refractive index $n_1$ of the resin in the region alpha, preferably 1.35 to 1.65, more preferably 1.40 to 1.60, and further more preferably 1.45 to 1.55. In addition, the refractive index $n_2$ of the resin in the region alpha of at least 1.35 increases a degree of freedom in selection of resin. In addition, the refractive index $n_2$ of the resin in the region beta of no greater than 1.65 can provide superior light extraction efficiency and superior normal brightness to a surface light emitter.

In the optical film of the first embodiment, the difference between the refractive index $n_1$ of the resin in the region alpha and the refractive index $n_2$ of the resin in the region beta is preferably at least 0.02, more preferably at least 0.05, and further more preferably at least 0.10, for superior light extraction efficiency of a surface light emitter.

The region alpha and the region beta in the optical film of the first embodiment are composed mainly of a resin.

The content of the resin in the region alpha in the optical film of the first embodiment is preferably at least 50% by mass, more preferably 60% by mass, and further more preferably at least 70% by mass in a total mass of the region alpha, for superior light extraction efficiency of a surface light emitter.

The content of the resin in the region beta in the optical film of the first embodiment is preferably at least 50% by mass, more preferably 60% by mass, and further more preferably at least 70% by mass in a total mass of the region beta, for superior light extraction efficiency of a surface light emitter.

The region alpha and the region beta in the optical film of the first embodiment can contain fine particles as necessary.

The content of the fine particles in the region alpha $P_1$ in the optical film of the first embodiment is preferably no greater than 50% by mass, no greater than 40% by mass, and further more preferably no greater than 30% by mass in a total mass of the region alpha, for superior light extraction efficiency of a surface light emitter.

The content of the fine particles in the region beta $P_2$ in the optical film of the first embodiment is preferably no greater than 50% by mass, no greater than 40% by mass, and further more preferably no greater than 30% by mass in a total mass of the region beta, for superior light extraction efficiency of a surface light emitter.

The fine particles contained in the region alpha and the region beta in the optical film of the first embodiment can be either the same or different in content, refractive index, material, particle diameter, particle shape, and the like between the region alpha and the region beta.

(Second Embodiment of Optical Film)

The second embodiment of the optical film of the present invention is an optical film in which the region beta contains fine particles; the region alpha contains fine particles as necessary; and the content $P_1$ of the fine particles in the region alpha is lower than the content $P_2$ of the fine particles in the region beta.

The optical film of the second embodiment is superior in light extraction efficiency of a surface light emitter, and superior in suppressing the output angle dependence of the output light wavelength.

The content of the fine particles in the region alpha $P_1$ in the optical film of the second embodiment is only required to be lower than the content of the fine particles in the region beta $P_2$, and preferably no greater than 12% by mass, more preferably no greater than 7% by mass, and further more preferably no greater than 3% by mass in a total mass of the region alpha, for superior light extraction efficiency of a surface light emitter.

The content of the fine particles in the region beta $P_2$ in the optical film of the second embodiment is only required to be lower than the content of the fine particles in the region alpha $P_1$, and preferably 5 to 50% by mass, more preferably 15 to 45% by mass, and further more preferably 22 to 40% by mass in a total mass of the region beta. The content of the fine particles in the region beta $P_2$ of at least 5% by mass can provide superior suppression of output angle dependence of the output light wavelength of a surface light emitter. In addition, the content of the fine particles in the region beta $P_2$ of no greater than 50% by mass can provide superior light extraction efficiency to a surface light emitter.

The fine particles contained in the region alpha and the region beta in the optical film of the second embodiment can be either the same or different in refractive index, material, particle diameter, particle shape, and the like between the region alpha and the region beta.

The difference between the content of the fine particles in the region alpha $P_1$ and the content of the fine particles in the region beta $P_2$ in the optical film of the second embodiment is preferably 3 to 50% by mass, more preferably 5 to 45% by mass, and further more preferably 10 to 40% by mass. The difference between the content of the fine particles in the region alpha $P_1$ and the content of the fine particles in the region beta $P_2$ of at least 3% by mass can provide superior suppression of output angle dependence of the output light wavelength of a surface light emitter. In addition, the difference between the content of the fine particles in the region alpha $P_1$ and the content of the fine particles in the region beta $P_2$ of no greater than 50% by mass can provide superior light extraction efficiency to a surface light emitter.

The region alpha and the region beta in the optical film of the second embodiment are composed mainly of a resin.

The content of the resin in the region alpha in the optical film of the second embodiment is preferably at least 88% by mass, more preferably 93% by mass, and further more preferably at least 97% by mass in a total mass of the region alpha, for superior light extraction efficiency of a surface light emitter.

The content of the resin in the region beta in the optical film of the second embodiment is preferably at least 50% by mass, more preferably 55% by mass, and further more preferably at least 60% by mass in a total mass of the region beta, for superior light extraction efficiency of a surface light emitter.

The resin in the region alpha and the region beta in the optical film of the second embodiment can be either the same or different in refractive index, material, and the like between the region alpha and the region beta.

In the optical film of the second embodiment, the refractive index $n_1$ of the resin in the region alpha and the refractive index $n_2$ of the resin in the region beta are preferably different, for superior light extraction efficiency of a surface light emitter. In the optical film of the second embodiment, the difference between the refractive index $n_1$ of the resin in the region alpha and the refractive index $n_2$ of the resin in the region beta is preferably at least 0.02 and more preferably at least 0.05, for superior light extraction efficiency of a surface light emitter.

In the optical film of the second embodiment, the difference between the refractive index $n_2$ of the resin in the region beta and the refractive index $n_b$ of the fine particles contained in the region beta is preferably at least 0.02, more preferably at least 0.05, and further more preferably at least 0.08, for superior suppression of output angle dependence of the output light wavelength of a surface light emitter.

It should be noted that the refractive index of the fine particles in the present Specification is a value measured as follows.

A film of Cargille refractive index liquid is formed on a glass plate, fine particles are added into the film, and another glass plate is layered thereon. For a sample obtained by thus fixing a fine particle-added film by interposing between two glass plates, total light transmittance is measured using a haze meter. For various samples in which the refractive index of the Cargille refractive index liquid is changed, total light transmittance is measured in a similar manner to the above. A refractive index for the Cargille refractive index liquid in the sample that gives the greatest value among all the total light transmittance values thus measured is the refractive index of the fine particles.

(Third Embodiment of Optical Film)

The third embodiment of the optical film of the present invention is an optical film in which the region alpha contains fine particles; the region beta contains fine particles as necessary; and the content $P_1$ of the fine particles in the region alpha is higher than the content $P_2$ of the fine particles in the region beta.

The optical film of the third embodiment is particularly superior in flaw resistance and light extraction efficiency of a surface light emitter.

The content of the fine particles in the region alpha $P_1$ in the optical film of the third embodiment is only required to be higher than the content of the fine particles in the region beta $P_2$, and preferably 5 to 50% by mass, more preferably 15 to 45% by mass, and further more preferably 22 to 40% by mass in a total mass of the region alpha.

The content $P_1$ of the fine particles in the region alpha of at least 5% by mass can provide superior flaw resistance to the optical film. In addition, the content of the fine particles in the region alpha $P_2$ of no greater than 50% by mass can provide superior light extraction efficiency to a surface light emitter.

The content of the fine particles in the region beta $P_2$ in the optical film of the third embodiment is only required to be lower than the content of the fine particles in the region alpha $P_1$, and preferably no greater than 12% by mass, more preferably no greater than 7% by mass, and further more preferably no greater than 3% by mass in a total mass of the region beta, for superior light extraction efficiency of a surface light emitter.

The fine particles contained in the region alpha and the region beta in the optical film of the third embodiment can be either the same or different in refractive index, material, particle diameter, particle shape, and the like between the region alpha and the region beta.

The difference between the content of the fine particles in the region alpha $P_1$ and the content of the fine particles in the region beta $P_2$ in the optical film of the third embodiment is preferably 3 to 50% by mass, more preferably 5 to 45% by mass, and further more preferably 10 to 40% by mass. The difference between the content of the fine particles in the region alpha $P_1$ and the content of the fine particles in the region beta $P_2$ of at least 3% by mass can provide superior suppression of output angle dependence of the output light wavelength of a surface light emitter. In addition, the difference between the content of the fine particles in the region alpha $P_1$ and the content of the fine particles in the region beta $P_2$ of no greater than 50% by mass can provide superior light extraction efficiency to a surface light emitter.

The region alpha and the region beta in the optical film of the third embodiment are composed mainly of a resin.

The content of the resin in the region alpha in the optical film of the third embodiment is preferably at least 50% by mass, more preferably 55% by mass, and further more preferably at least 60% by mass in a total mass of the region alpha, for superior light extraction efficiency of a surface light emitter.

The content of the resin in the region beta in the optical film of the third embodiment is preferably at least 88% by mass, more preferably 93% by mass, and further more preferably at least 97% by mass in a total mass of the region beta, for superior light extraction efficiency of a surface light emitter.

The resin in the region alpha and the region beta in the optical film of the third embodiment can be either the same or different in refractive index, material, and the like between the region alpha and the region beta.

In the optical film of the third embodiment, the refractive index $n_1$ of the resin in the region alpha and the refractive index $n_2$ of the resin in the region beta are preferably different, for superior light extraction efficiency of a surface light emitter. In the optical film of the third embodiment, the difference between the refractive index $n_1$ of the resin in the region alpha and the refractive index $n_2$ of the resin in the region beta is preferably at least 0.02 and more preferably at least 0.05, for superior light extraction efficiency of a surface light emitter.

(Material of Optical Film)

As a material composing the optical film of the present invention, any resin and/or any fine particles can be used within a range corresponding to any one of the first embodiment, the second embodiment, and the third embodiment that are described above.

(Resin)

As the resin, for example, acrylic resin; polycarbonate resin; polyester resins such as polyethylene terephthalate, polybutylene terephthalate, and polyethylene naphthalate; styrene resins such as polystyrene and ABS resin; vinyl chloride resin; and the like can be exemplified. Among these, acrylic resin that has high light transmittance in the visible light wavelength range and superior heat resistance, physical properties, and molding processability is preferable.

As a method for producing the resin, a method of curing a thermosetting composition by heating, a method of curing an active energy ray curing composition by irradiation of an active energy ray, and the like can be exemplified. Among these methods for producing the resin, the method of curing an active energy ray curing composition by irradiation of an active energy ray that involves simple steps and provides quick curing is preferable.

As the active energy ray, for example, ultraviolet ray, electron ray, X-ray, infrared ray, visible light ray, and the like can be exemplified. Among these active energy rays, ultraviolet ray and electron ray that are superior in curing properties of the active energy ray curing composition and suppress deterioration of the optical film are preferable, and ultraviolet ray is more preferable.

The active energy ray curing composition is not particularly limited as long as it can be cured by an active energy ray; however, an active energy ray curing composition containing a polymerizable monomer (A), a crosslinkable monomer (B), and an active energy polymerization initiator (C) that is superior in operability and curability, and provides superior physical properties to the optical film such as softness, heat resistance, flaw resistance, solvent resistance, light transmittance, and the like is preferable.

The thermosetting composition is not particularly limited as long as it can be cured by heat; however, a thermosetting composition containing the polymerizable monomer (A), the crosslinkable monomer (B), and a heat polymerization initiator (D) that is superior in operability and curability, and provides superior physical properties to the optical film such as softness, heat resistance, flaw resistance, solvent resistance, light transmittance, and the like is preferable.

As the polymerizable monomer (A), for example:
(meth)acrylates such as methyl(meth)acrylate, ethyl(meth)acrylate, n-propyl(meth)acrylate, iso-propyl(meth)acrylate, n-butyl(meth)acrylate, iso-butyl(meth)acrylate, sec-butyl (meth)acrylate, tert-butyl(meth)acrylate, n-hexyl(meth) acrylate, cyclohexyl(meth)acrylate, n-octyl(meth)acrylate, 2-ethylhexyl(meth)acrylate, dodecyl(meth)acrylate, tridecyl (meth)acrylate, stearyl(meth)acrylate, alkyl (meth)acrylate, phenyl(meth)acrylate, benzil (meth)acrylate, phenoxy ethyl (meth)acrylate, isobornyl(meth)acrylate, glycidyl(meth) acrylate, tetrahydrofurfuryl(meth)acrylate, norbornyl(meth) acrylate, adamantyl(meth)acrylate, dicyclopentenyl(meth) acrylate, dicyclopentanyl(meth)acrylate, tetracyclododecanyl(meth)acrylate, cyclohexanedimethanol mono(meth)acrylate, 2-hydroxyethyl (meth)acrylate, 2-hydroxypropyl(meth)acrylate, 3-hydroxypropyl(meth)acrylate, 2-hydroxybutyl(meth)acrylate, 3-hydroxybutyl(meth) acrylate, 4-hydroxybutyl(meth)acrylate, 2-methoxyethyl (meth)acrylate, 2-ethoxyethyl(meth)acrylate, 3-methoxybutyl(meth)acrylate, butoxyethyl(meth)acrylate, methoxytriethylene glycol (meth)acrylate, methoxydipropylene glycol(meth)acrylate, 2-(meth)acryloyloxymethyl-2-methylbicycloheptane, 4-(meth)acryloyloxymethyl-2-methyl-2-ethyl-1,3-dioxolan, 4-(meth)acryloyloxymethyl-2-methyl-2-isobutyl-1,3-dioxolan, trimethylolpropane formal (meth)acrylate, ethylene oxide-modified phosphoric acid (meth)acrylate, and caprolactone-modified phosphoric acid (meth)acrylate;
(meth)acrylic acid;
(meth)acrylonitrile;
(meth)acrylic amides such as (meth)acrylamide, N-dimethyl (meth)acrylamide, N-diethyl(meth)acrylamide, N-butyl (meth)acrylamide, dimethylaminopropyl(meth)acrylamide, N-methylol(meth)acrylamide, N-methoxymethyl(meth) acrylamide, N-butoxymethyl (meth)acrylamide, (meth)acryloylmorpholine, hydroxyethyl(meth)acrylamide, and methylene bis(meth)acrylamide;
epoxy(meth)acrylates such as a compound formed by reacting a bisphenol type epoxy resin provided by a condensation reaction between bisphenols (bisphenol A, bisphenol F, bisphenol S, tetrabromobisphenol A) and epichlorohydrin, with (meth)acrylic acid or derivative thereof;
aromatic vinyl such as styrene and alpha-methyl styrene;
vinyl ethers such as vinyl methyl ether, vinyl ethyl ether, and 2-hydroxyethyl vinyl ether;
carboxylic acid vinyl such as vinyl acetate and vinyl butylate; and
olefins such as ethylene, propylene, butene, and isobutene. These polymerizable monomers (A) can be used either singly, or in combination of 2 kinds or more. Among these polymerizable monomers (A), those providing superior operability and curability to the active energy ray curing composition, and providing superior physical properties to the optical film such as softness, heat resistance, flaw resistance, solvent resistance, light transmittance, and the like:
(meth)acrylates; epoxy(meth)acrylates; aromatic vinyl; and olefins are preferable,
and (meth)acrylates and epoxy(meth)acrylates are more preferable.

In the present Specification, (meth)acrylate indicates acrylate or methacrylate.

The content of the polymerizable monomer (A) in the active energy ray curing composition is preferably 0.5 to 60% by mass, more preferable 1 to 57% by mass, and further more preferably 2 to 55% by mass in a total mass of the active energy ray curing composition. The content of the polymerizable monomer (A) of at least 0.5% by mass can provide superior operability to the active energy ray curing composition and superior base material adherence to the optical film. The content of the polymerizable monomer (A) of no greater than 60% by mass can provide superior cross-linkability and curability to the active energy ray curing composition and superior solvent resistance to the optical film.

As the crosslinkable monomer (B), for example: hexa(meth)acrylates such as dipentaerythritol hexa(meth)acrylate and caprolactone-modified dipentaerythritol hexa(meth)acrylate;

penta(meth)acrylates such as dipentaerythritol hydroxy penta (meth)acrylate and caprolactone-modified dipentaerythritol hydroxy penta(meth)acrylate;

tetra(meth)acrylates such as di-trimethylolpropane tetra(meth)acrylate, pentaerythritol tetra(meth)acrylate, pentaerythritol ethoxy-modified tetra(meth)acrylate, di-pentaerythritol hexa(meth)acrylate, di-pentaerythritol penta(meth)acrylate, and tetramethylol methane tetra(meth)acrylate;

tri(meth)acrylates such as trimethylolpropane tri(meth)acrylate, tris-ethoxylated trimethylolpropane tri(meth)acrylate, pentaerythritol tri(meth)acrylate, ethoxylated pentaerythritol tri(meth)acrylate, tris (2-(meth)acryloyloxyethyl)isocyanurate, aliphatic hydrocarbon-modified trimethylolpropane tri(meth)acrylate with carbon number of 2 to 5, and isocyanuric acid ethylene oxide-modified tri(meth)acrylate;

di(meth)acrylates such as triethylene glycol di(meth)acrylate, diethylene glycol di(meth)acrylate, 1,3-butylene glycol di(meth)acrylate, 1,4-butanediol di(meth)acrylate, 1,5-pentanediol di(meth)acrylate, 1,6-hexanediol di(meth)acrylate, nonanediol di(meth)acrylate, neopentylglycol di(meth)acrylate, methylpentanediol di(meth)acrylate, diethylpentanediol di(meth)acrylate, hydroxypivalic acid neopentylglycol di(meth)acrylate, tetraethylene glycol di(meth)acrylate, tripropylene glycol di(meth)acrylate, polybutylene glycol di(meth)acrylate, tricyclo decane dimethanol di(meth)acrylate, 2,2-bis(4-(meth)acryloxypolyethoxyphenyl) propane, 2,2-bis(4-(meth)acryloxyethoxyphenyl)propane, 2,2-bis(4-(3-(meth)acryloxy-2-hydroxy propoxy) phenyl) propane, 1,2-bis(3-(meth)acryloxy-2-hydroxy propoxy) ethane, 1,4-bis(3-(meth)acryloxy-2-hydroxy propoxy) butane, bis(2-(meth)acryloyloxyethyl)-2-hydroxyethyl isocyanurate, cyclohexanedimethanol di(meth)acrylate, dimethyloltricyclodecane di(meth)acrylate, hydroxypivalic acid neopentylglycol di(meth)acrylate, polyethoxylated cyclohexanedimethanol di(meth)acrylate, polypropoxylated cyclohexanedimethanol di(meth)acrylate, polyethoxylated bisphenol A di(meth)acrylate, polypropoxylated bisphenol A di(meth)acrylate, hydrogenated bisphenol A di(meth)acrylate, polyethoxylated hydrogenated bisphenol A di(meth)acrylate, polypropoxylated hydrogenated bisphenol A di(meth)acrylate, bis phenoxy fluorene ethanol di(meth) acrylate, neopentylglycol-modified trimethylolpropane di(meth)acrylate, di(meth)acrylate of epsilon-caprolactone adduct of hydroxypivalic acid neopentylglycol, di(meth) acrylate of gamma-butyrolactone adduct of hydroxypivalic acid neopentylglycol, di(meth)acrylate of caprolactone adduct of neopentylglycol, di(meth)acrylate of caprolactone adduct of butylene glycol, di(meth)acrylate of caprolactone adduct of cyclohexanedimethanol, di(meth)acrylate of caprolactone adduct of dicyclo pentanediol, di(meth)acrylate of ethylene oxide adduct of bisphenol A, di(meth) acrylate of propylene oxide adduct of bisphenol A, di(meth) acrylate of caprolactone adduct of bisphenol A, di(meth) acrylate of caprolactone adduct of hydrogenated bisphenol A, di(meth)acrylate of caprolactone adduct of bisphenol F, and isocyanuric acid ethylene oxide-modified di(meth)acrylate; diallyls such as diallyl phthalate, diallyl terephthalate, diallyl isophthalate, diethyleneglycol diallyl carbonate; allyl (meth)acrylate;

divinylbenzene;

methylenebisacrylamide;

polyester di(meth)acrylates such as a compound obtained by a reaction of polybasic acid (phthalic acid, succinate, hexahydrophthalic acid, tetrahydrophthalic acid, terephthalic acid, azelaic acid, adipic acid, and the like) with polyvalent alcohol (ethyleneglycol, hexanediol, polyethylene glycol, polytetramethylene glycol, and the like) and (meth)acrylic acid or a derivative thereof;

urethane polyfunctional (meth)acrylates such as a compound obtained by a reaction of a diisocyanate compound (tolylene diisocyanate, isophorone diisocyanate, xylene diisocyanate, dicyclohexyl methane diisocyanate, hexamethylene diisocyanate, and the like) with hydroxyl group-containing (meth)acrylate (for example, polyfunctional (meth) acrylate such as 2-hydroxyethyl(meth)acrylate, 2-hydroxypropyl(meth)acrylate, 4-hydroxybutyl(meth)acrylate, pentaerythritol tri(meth)acrylate, and the like) and a compound obtained by adding a diisocyanate compound to a hydroxyl group of alcohols (one or at least two of alkane diol, polyether diol, polyester diol, spiroglycol compound, and the like) and then reacting hydroxyl group-containing (meth)acrylate with remaining isocyanate groups;

divinyl ethers such as diethyleneglycol divinyl ether, triethylene glycol divinyl ether; and dienes such as butadiene, isoprene, and dimethylbutadiene can be exemplified. These crosslinkable monomers (B) can be used either singly, or in combination of 2 kinds or more. Among these crosslinkable monomers (B), those providing superior physical properties to the optical film such as softness, heat resistance, flaw resistance, solvent resistance, light transmittance, and the like:

hexa(meth)acrylates, penta(meth)acrylates, tetra(meth)acrylates, tri(meth)acrylates, di(meth)acrylates, diallyls, allyl (meth)acrylate, polyester di(meth)acrylates, and urethane polyfunctional (meth)acrylates are preferable, and hexa(meth)acrylates, penta(meth)acrylates, tetra(meth)acrylates, tri (meth)acrylates, di(meth)acrylates, polyester di(meth)acrylates, and urethane polyfunctional (meth)acrylates are more preferable.

The content of the crosslinkable monomer (B) in the active energy ray curing composition is preferably 30 to 98% by mass, more preferably 35 to 97% by mass, and further more preferably 40 to 96% by mass in a total mass of the active energy ray curing composition. The content of the crosslinkable monomer (B) of at least 30% by mass can provide superior cross-linkability and curability to the active energy ray curing composition and superior solvent resistance to the optical film. In addition, the content of the crosslinkable monomer (B) of no greater than 98% by mass can provide superior softness to the optical film.

As the active energy polymerization initiator (C), for example, carbonyl compounds such as benzoin, benzoin methyl ether, benzoin ethyl ether, benzoin isopropyl ether, benzoin isobutyl ether, acetoin, benzylic, benzophenone, p-methoxybenzophenone, 2,2-diethoxyacetophenone, α,α-dimethoxy-α-phenylacetophenone, benzyl dimethyl ketal, methyl phenylglyoxylate, ethyl phenylglyoxylate, 4,4'-bis (dimethylamino)benzophenone, 1-hydroxycyclohexyl phenyl ketone, 2-hydroxy-2-methyl-1-phenylpropan-1-one, and 2-ethylanthraquinone;

sulfur compounds such as tetramethylthiuram monosulfide and tetramethylthiuram disulfide;

and acylphosphine oxides such as 2,4,6-trimethylbenzoyl diphenylphosphine oxide and benzoyldiethoxyphosphine oxide can be exemplified. These active energy polymerization initiators (C) can be used either singly or in combination of 2 kinds or more. Among these active energy polymerization initiators (C), those providing superior operability and curability to the active energy ray curing composition and light transmittance to the optical film: carbonyl compounds and acylphosphine oxides are preferable, and carbonyl compounds are more preferable.

The content of the active energy ray polymerization initiator (C) in the active energy ray curing composition is preferably 0.1 to 10% by mass, more preferable 0.5 to 8% by mass, and further more preferably 1 to 5% by mass in a total mass of the active energy ray curing composition. The content of the active energy ray polymerization initiator (C) of at least 0.1% by mass can provide superior operability and curability to the active energy ray curing composition. In addition, the content of the active energy ray polymerization initiator (C) of no greater than 10% by mass can provide superior light transmittance to the optical film.

As the heat polymerization initiator (D), for example, azo compounds such as isobutyronitrile, 2-methyl butyronitrile, 2,4-dimethyl valeronitrile, 4-cyanovaleric acid, and 2-methylpropionic acid; and
peroxides such as benzoyl peroxide, tert-butyl hydroperoxide, cumene hydroperoxide, and di-tert-butyl peroxide can be exemplified. These heat polymerization initiators (D) can be used either singly, or in combination of 2 kinds or more. Among these heat polymerization initiators (D), those providing superior operability and curability to the thermosetting composition and superior light transmittance to the optical film: isobutyronitrile and 2-methyl butyronitrile are preferable and isobutyronitrile is more preferable.
(Fine Particles)

The fine particles are not particularly limited as long as they are fine particles having a light diffusing effect for the visible light wavelength range (approximately 400 to 700 nm), and known fine particles can be used. One type of fine particles may be singly used and two or more types may also be used in combination.

As a material for the fine particles, for example, metal such as gold, silver, silicon, aluminium, magnesium, zirconium, titanium, zinc, germanium, indium, tin, antimony, and cerium; metal oxide such as silicon oxide, aluminium oxide, magnesium oxide, zirconium oxide, titanium oxide, zinc oxide, germanium oxide, indium oxide, tin oxide, indium tin oxide, antimony oxide, and cerium oxide;
metal hydroxide such as aluminium hydroxide;
metal carbonate such as magnesium carbonate;
metal nitride such as silicon nitride; and
resin such as acrylic resin, styrene resin, silicone resin, urethane resins, melamine resin, epoxy resin can be exemplified. These materials for the fine particles can be used either singly or in combination of 2 kinds or more. Among these materials for the fine particles, those providing superior operability to the optical film:
silicon, aluminium, magnesium, silicon oxide, aluminium oxide, magnesium oxide, aluminium hydroxide, magnesium carbonate, acrylic resin, styrene resin, silicone resin, urethane resin, melamine resin, and epoxy resin are preferable, and silicon oxide, aluminium oxide, aluminium hydroxide, magnesium carbonate, acrylic resin, styrene resin, silicone resin, urethane resin, melamine resin, and epoxy resin are more preferable.

The volume average particle diameter of the fine particles is preferably 0.5 to 20 µm, more preferably 0.7 to 15 µm, and further more preferably 0.8 to 10 µm. The volume average particle diameter of the fine particles of at least 0.5 µm allows effective diffusion of light of the visible light wavelength range. In addition, the volume average particle diameter of the fine particles of no greater than 20 µm provides superior fluidity when blended with the active energy ray curing composition or the thermosetting composition.

As a shape of the fine particles, for example, a spherical shape, a cylindrical shape, a cubical shape, a cuboidal shape, a pyramid shape, a conical shape, a star shape, a donut-like shape, a daisy-chain shape, a powder shape, and an irregular shape can be exemplified. These shapes of the fine particles can be used either singly or in combination of 2 kinds or more. Among these shapes, those allowing effective diffusion of light of the visible light wavelength range: a spherical shape, a cubical shape, a cuboidal shape, a pyramid shape, and a star shape are preferable, and a spherical shape is more preferable.
(Configuration of Optical Film)

Figure 4:
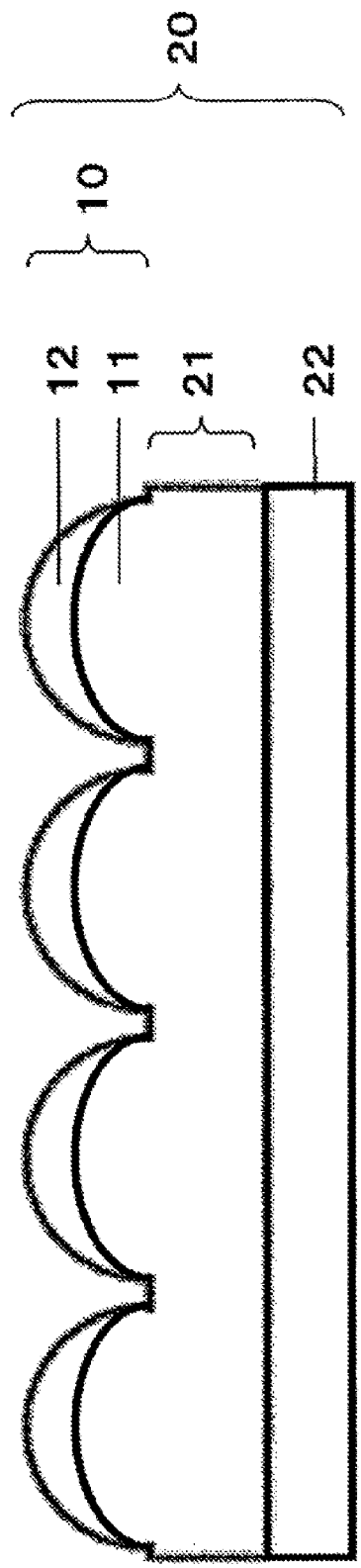
FIG. 4 is a schematic cross-sectional view showing an example of the optical film of the present invention.

The optical film of the present invention is preferably an optical film 20 shown in FIG. 4, in which a buffer layer 21 is formed between the bottom surface portion of the convex microlens 10 and the base material 22, that is superior in maintenance of a shape of the convex microlens. However, the optical film of the present invention is not limited thereto.
(Buffer Layer)

The buffer layer 21 mainly has a function of maintaining the convex shape of the microlens by buffering stress associated with polymerization shrinkage upon curing.

As a material of the buffer layer, a known resin and known fine particles can be used. For the sake of simple steps and high adherence with the base material as a result of making the buffer layer and the convex microlens an integrated continuous film-like body, the material of the buffer layer is preferably the same as the material of the region alpha.

The thickness of the buffer layer is preferably 1 to 60 µm, more preferably 3 to 40 µm, and further more preferably 5 to 30 µm. The thickness of the buffer layer of at least 1 µm can provide superior operability to the optical film. The thickness of the buffer layer of no greater than 60 µm can provide superior light extraction efficiency to a surface light emitter.
(Base Material)

In a case in which the optical film, including the base material 22, is laminated onto an organic EL light emitting device, the base material 22 is preferably composed of a material that transmits light of the visible light wavelength range easily. Alternatively, in a case in which the active energy ray curing composition is interposed between the roll mold and the base material 22 and irradiated with an active energy ray during production of the optical film, the base material 22 is preferably composed of a material that transmits the active energy ray easily.

As a material of the base material, for example, acrylic resin;
polycarbonate resin;
polyester resin such as polyethylene terephthalate, polybutylene terephthalate, and polyethylene naphthalate; styrene resin such as polystyrene, and ABS resin;
vinyl chloride resin;
cellulosic resin such as diacetylcellulose, and triacetylcellulose;
imide resin such as polyimide and polyimide amide;
glass; and
metal can be exemplified. Among these materials of the base material, those being superior in softness and transmittance of the active energy ray: acrylic resin, polycarbonate resin, polyester resin, styrene resin, cellulosic resin, and imide resin are preferable, and acrylic resin, polycarbonate resin, polyester resin, and imide resin are more preferable.

The thickness of the base material is preferably 10 to 500 µm, more preferably 20 to 400 µm, and further more preferably 50 to 300 µm. The thickness of the base material of at least 10 µm can provide superior operability to the optical film. In addition, the thickness of the base material of no greater than 500 µm can provide superior light extraction efficiency to a surface light emitter.

In order to increase adherence between the buffer layer and the base material, an adhesive treatment can be done on the surface of the base material as necessary.

As a method of the adhesive treatment, for example, a method of forming an adhesive layer composed of polyester resin, acrylic resin, urethane resin and the like on the surface of the base material, and a method of roughening the surface of the base material can be exemplified.

In addition to the adhesive treatment, surface treatment such as antistatic treatment, antireflection treatment, and treatment for preventing sticking between the base materials can be done on the base material as necessary.

Figure 5:
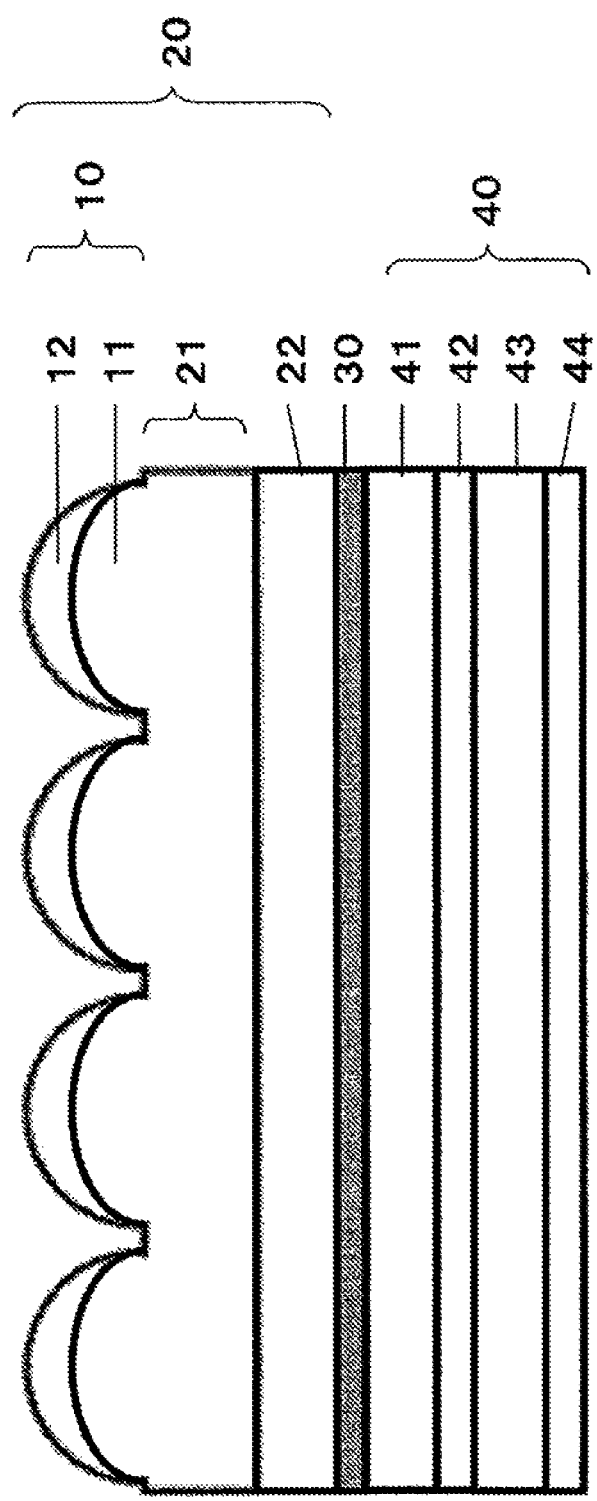
FIG. 5 is a schematic cross-sectional view showing an example of a surface light emitter of the present invention.

In order to make the optical film of the present invention optically adhere to the surface light emitter, an adhesive layer can be provided on a surface of the optical film without the convex microlens. In a case in which the optical film has the base material, the adhesive layer can be provided on a top surface of the base material as shown in FIG. 5 (described later). The adhesive layer is not particularly limited and can be formed by applying a known adhesive agent.

In order to increase operability of the optical film, a protective film can be provided on the surface of the adhesive layer. The protective film can be removed from the adhesive layer before applying the optical film on the surface of the organic EL light emitting device.

The protective film is not particularly limited and a known protective film can be used.

(Method of Producing Optical Film)

As the method of producing the optical film of the present invention, a method including the following steps that are sequentially performed, the method having simple steps and being superior in formability of the optical film, is preferable:

step A: a step of rotating a roll mold having an outer peripheral surface provided with a plurality of aligned concave microlens transfer units, applying an active energy ray curing composition B onto the outer peripheral surface of the roll mold while making a base material travel in a rotational direction of the roll mold along the outer peripheral surface of the roll mold, and filling a part of a concave shape of the microlens transfer units with the active energy ray curing composition B;

step B: a step of providing an active energy ray curing composition A to between the outer peripheral surface of the roll mold and the base material;

step C: a step of irradiating a region between the outer peripheral surface of the roll mold and the base material with an active energy ray, in a state in which the active energy ray curing composition A is interposed between the outer peripheral surface of the roll mold and the base material; and step D: a step of separating a cured product obtained in the step C from the roll mold.

Figure 6:
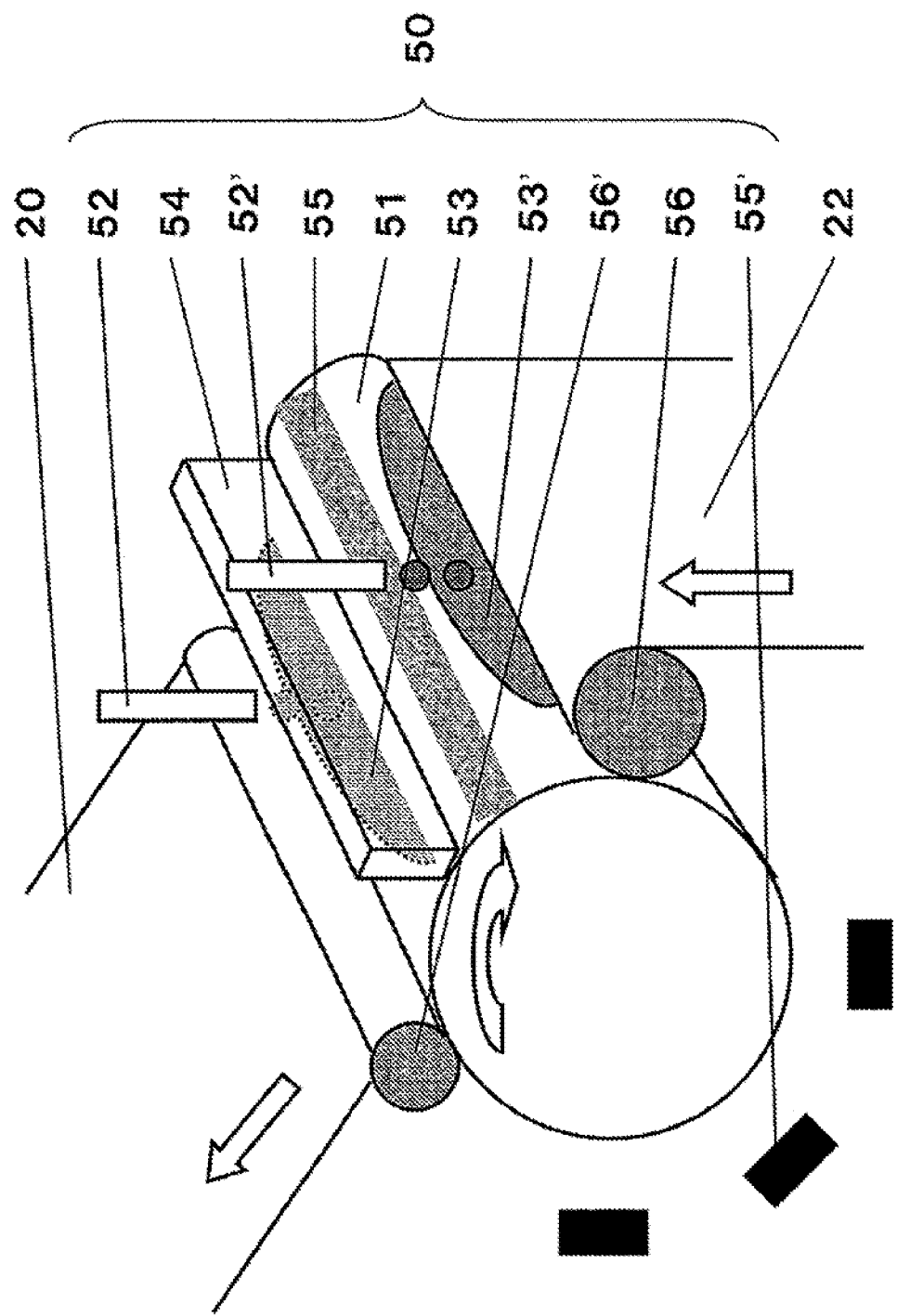
FIG. 6 is a schematic view showing an example of a method for producing an optical film of the present invention.

The method including steps A to D that are sequentially performed is realized by, for example, using a manufacturing apparatus shown in FIG. 6.

The method of producing the optical film of the present invention using the manufacturing apparatus shown in FIG. 6 is described hereinafter; however, the method of producing the optical film of the present invention is not limited to the method using the manufacturing apparatus shown in FIG. 6.

(Step A)

Step A is a step of rotating a roll mold 51 having an outer peripheral surface provided with a plurality of aligned concave microlens transfer units, applying an active energy ray curing composition B onto the outer peripheral surface of the roll mold 51 while making a base material 22 travel in a rotational direction of the roll mold 51 (a direction of an arrow in FIG. 6) along the outer peripheral surface of the roll mold 51, and filling a part of a concave shape of the microlens transfer units with the active energy ray curing composition B.

As the roll mold 51, for example, a metallic mold such as aluminium, brass, and steel;
a resin mold such as silicone resin, urethane resin, epoxy resin, ABS resin, fluorine resin, polymethylpentene resin;
a metal-plated resin mold;
and a mold made of a blended material of resin and various kinds of metallic powder can be exemplified. Among these roll molds 51, a metallic mold that is superior in heat resistance and mechanical strength and suitable for continuous production is preferable. More specifically, a metallic mold is preferable in many aspects including: polymerization heat resistance, deformation resistance, flaw resistance, temperature control, and precision molding.

The roll mold 51 has transfer units of a concave shape corresponding to the convex shape, for shaping the convex microlenses on the optical film 20.

As a method for forming the transfer units, for example, cutting by a diamond bit and etching as disclosed in a pamphlet of PCT International Publication No. 2008/069324 can be exemplified. Among these methods for forming the transfer units, in a case of forming a concave shape with a curved face such as a spherical segment shape, etching as disclosed in a pamphlet of PCT International Publication No. 2008/069324 is preferable from the viewpoint of superior productivity of the roll mold 51; and in a case of forming a concave shape without a curved face such as a pyramid shape, cutting by a diamond bit is preferable from the viewpoint of superior productivity of the roll mold 51.

Alternatively, as a method for forming the transfer units, a method of forming a metallic thin film by electroforming from a master mold having convex shapes, which are inverted shapes of the concave shapes of the transfer units, and then obtaining a cylindrical roll mold by wrapping the metallic thin film around a roll core member can be employed.

The rotation speed of the roll mold 51 is preferably 0.1 to 50 m/min, more preferably 0.3 to 40 m/min, and further more preferably 0.5 to 30 m/min, from the viewpoint of superior formability and productivity of the optical film.

The travel speed of the base material 22 is preferably 0.1 to 50 m/min, more preferably 0.3 to 40 m/min, and further more preferably 0.5 to 30 m/min, from the viewpoint of superior formability and productivity of the optical film.

The rotation speed of the roll mold 51 and the travel speed of the base material 22 are preferably similar, from the viewpoint of superior formability of the optical film.

As a method of applying the active energy ray curing composition B on the outer peripheral surface of the roll mold 51, for example: a method of applying by pouring the active energy ray curing composition B dropwise onto the roll mold 51 using a nozzle 52, bringing into contact with a doctor blade 54 to thereby form a bank 53, and spreading the active energy ray curing composition B in a width direction of the roll mold 51;

a method of applying by pouring the active energy ray curing composition B dropwise onto the roll mold 51 using the nozzle 52, and spreading the active energy ray curing composition B in a width direction of the roll mold 51 under pressure from a nip roll or an air curtain; and a method of applying by pouring the active energy ray curing composition B dropwise onto the doctor blade 54, bringing the active energy ray curing composition B along the doctor blade 54 to the outer peripheral surface of the roll mold 51 to thereby form a bank 53, and spreading the active energy ray curing composition B in a width direction of the roll mold 51 can be exemplified. Among these methods of applying the active energy ray curing composition B, the method of applying by pouring the active energy ray curing composition B dropwise onto the doctor blade 54, bringing the active energy ray curing composition B along the doctor blade 54 to the outer peripheral surface of the roll mold 51 to thereby form a bank 53, and spreading the active energy ray curing composition B in a width direction of the roll mold 51 is preferable from the viewpoint of suppression of generation of air bubbles in the microlenses and productivity of the optical film.

Either a single (one) or a plurality of nozzles 52 can be provided; however, a single (one) nozzle 52 that allows uniform application of the active energy ray curing composition B is preferable.

The bank 53 is preferably formed on the outer peripheral surface of the roll mold 51 upon application of the active energy ray curing composition B, for uniform application of the active energy ray curing composition B.

The doctor blade 54 is effective for formation of the bank 53.

As a material of the doctor blade 54, for example, resin such as polyethylene resin, polypropylene resin, and polyester resin; and metal such as aluminium and stainless steel can be exemplified. Among these materials of the doctor blade 54, resin, particularly polyester resin, which is superior in softness and prevents damage to the roll mold 51 is preferable.

In place of the doctor blade 54, a roll coater, a bar coater and the like can also be used.

In order to extract light emitted from the organic EL light emitting device more through the region beta, it is preferable to cover the surface of the region alpha with the region beta as much as possible. For this end, application of the active energy ray curing composition B in the step A is preferably application for making the active energy ray curing composition B follow a surface of the concave microlens transfer unit on the outer peripheral surface of the roll mold 51. Making the active energy ray curing composition B follow a surface of the concave microlens transfer unit means that the active energy ray curing composition B flows while being pressed against the surface of the microlens transfer unit, to thereby form a convex surface following at least a part of the surface of the microlens transfer unit.

As a method of application that makes the active energy ray curing composition B follow a surface of the concave microlens transfer unit, for example, a method of: forming the bank 53 of the active energy ray curing composition B while pressing the doctor blade 54 having a tapered sharp edge, a roll coater, or a bar coater against the surface of the rotating roll mold 51; and applying a shearing force to the active energy ray curing composition B by a peripheral edge portion of the concave microlens transfer unit as well as the doctor blade 54, the roll coater, or the bar coater, to thereby generate surface tension acting on the surface of the active energy ray curing composition B following the concave shape, can be exemplified.

As a result, generation of air bubble in the optical film can thus be suppressed, the region alpha can thus be covered by the region beta as much as possible, and the region beta can function sufficiently in the optical film.

The base material 22 is preferably pressed by the nip roll 56 and a hold-down roll 56' toward the roll mold 51, for control of the thickness of the buffer layer.

As a material of the nip roll 56 and the hold-down roll 56', metal such as aluminium, stainless steel, and brass;

and the abovementioned metal with a rubber layer on a surface thereof can be exemplified. Among these materials of the nip roll 56 and the hold-down roll 56', metal with a rubber layer on a surface thereof is preferable.

As a material of the rubber layer, for example, ethylene-propylene rubber, butadiene rubber, urethane rubber, nitrile rubber, and silicone rubber can be exemplified. Among these materials of the rubber of the rubber layers, ethylene-propylene rubber and silicone rubber that are superior in active energy ray resistance are preferable.

The rubber layer on the surface of the nip roll 56 and the hold-down roll 56' is preferably 20 to 90 degrees, more preferably 40 to 85 degrees, and further more preferably 50 to 80 degrees in rubber hardness defined by JIS-K-6253. The rubber hardness of the rubber layer of at least 20 degrees provides superior suppression of generation of air bubbles in the optical film. In addition, the rubber hardness of the rubber layer of no greater than 90 degrees reduces a strain applied to the base material 22 and provides superior suppression of damage of the base material 22.

In order to make the active energy ray curing composition B follow a surface of the concave microlens transfer unit, it is preferable to control the viscosity of the active energy ray curing composition B or the temperature during application of the active energy ray curing composition B, in addition to the above described method. This is because, by controlling the viscosity or the temperature, a contact angle (wettability) upon contact between the concave shape on the outer peripheral surface of the roll mold 51 and the active energy ray curing composition B is determined and possibility of coating that follows the surface of the concave shape is determined. For example, there is a tendency that if the viscosity of the active energy ray curing composition B is too low, the active energy ray curing composition B stays only in a deep part of the concave shape and it is difficult to make follow the surface of the concave shape sufficiently, and, if the viscosity of the active energy ray curing composition B is too high, the active energy ray curing composition B does not flow to the deep part of the concave shape and it is difficult to make follow the surface of the concave shape sufficiently.

The viscosity of the active energy ray curing composition B is described later.

The temperature during application of the active energy ray curing composition B is preferably 10 to 90° C., and more preferably 20 to 80° C., for following and coating the surface of the concave shape on the outer peripheral surface of the roll mold 51.

The temperature during application of the active energy ray curing composition B can be controlled by providing heat source equipment such as a sheath heater and a hot water jacket as necessary, inside or outside of the roll mold 51.

(Step X)

In a case in which it is desired to define an interface clearly between the region alpha and the region beta in the microlens of the optical film 20, a step of irradiating the active energy ray curing composition B with an active energy ray (step X) is preferably included before step B.

It should be noted that, in the absence of step X, the vicinity of the interface between the region alpha and the region beta in the microlens is gradated, in other words the vicinity of the interface between the region alpha and the region beta is a region including components of both the region alpha and the region beta.

As a method of irradiating with an active energy ray, a method using an active energy ray irradiating device 55 can be exemplified.

Irradiation with an active energy ray by the active energy ray irradiating device 55 is preferably done uniformly in a width direction of the roll mold. Irradiation with active energy ray that is uniform in the width direction of the roll mold can be realized, for example, by connecting a light incident end of a line light composed of optical fibers to an ultraviolet lamp and arranging a linear light exit end of the line light in the vicinity of the roll mold such that a line direction is the width direction of the roll mold.

An accumulated amount of the active energy ray irradiated by the active energy ray irradiating device 55 is preferably 0.01 to 5 J/cm$^2$ and more preferably 0.1 to 3 J/cm$^2$ that is superior in curability of the active energy ray curing composition B and does not interfere with application of the active energy ray curing composition A.

A light shielding plate can be provided around the active energy ray irradiating device 55 as necessary, for preventing the active energy ray from the active energy ray irradiating device 55 from diffusing to cure the active energy ray curing composition A before being applied.

(Step B)

Step B is a step of providing the active energy ray curing composition A to between the outer peripheral surface of the roll mold 51 and the base material 22.

As a method of providing the active energy ray curing composition A to between the outer peripheral surface of the roll mold 51 and the base material 22, for example: a method of pouring the active energy ray curing composition A dropwise using a nozzle 52' onto the roll mold 51 with the active energy ray curing composition B applied thereonto, bringing into contact with the nip roll 56 through the base material 22 to thereby form a bank 53', and spreading the active energy ray curing composition A in the width direction of the roll mold 51; and a method of applying the active energy ray curing composition A onto a surface of the base material 22 in advance, and then joining the roll mold 51 with the active energy ray curing composition B applied thereonto with the base material with the active energy ray curing composition A applied thereonto, can be exemplified. Among these methods of applying the active energy ray curing composition A, a method of pouring the active energy ray curing composition A dropwise using a nozzle 52' onto the roll mold 51 with the active energy ray curing composition B applied thereonto, bringing into contact with the nip roll 56 through the base material 22 to thereby form a bank 53', and spreading the active energy ray curing composition A in the width direction of the roll mold 51 is preferable.

(Step C)

Step C is a step of irradiating a region between the outer peripheral surface of the roll mold 51 and the base material 22 with an active energy ray, in a state in which the active energy ray curing composition A is interposed between the outer peripheral surface of the roll mold 51 and the base material 22.

As a method of irradiating an active energy ray, a method using an active energy ray irradiating device 55' can be exemplified.

As a light source of the active energy ray in the active energy ray irradiating device 55', for example, a chemical lamp, a low pressure mercury lamp, a high pressure mercury lamp, a metal halide lamp, a electrodeless ultraviolet lamp, a visible light halogen lamp, a xenon lamp, and the like can be exemplified.

An accumulated amount of the active energy ray irradiated by the active energy ray irradiating device 55' is preferably 0.1 to 10 J/cm$^2$ and more preferably 0.5 to 8 J/cm$^2$ which is superior in curability of the active energy ray curing composition and suppresses deterioration of the optical film.

(Step D)

Step D is a step of separating a cured product obtained in the step C from the roll mold 51.

For facilitating separation of the cured product from the roll mold 51, surface treatment can be done on the outer peripheral surface of the roll mold 51 in advance.

As a method of surface treatment, for example: plating such as nickel plating, chrome plating, and diamond-like carbon coating; and
a method of applying a mold release agent such as a fluorine mold release agent, a silicone mold release agent, and vegetable oil can be exemplified.

(Active Energy Ray Curing Composition A and Active Energy Ray Curing Composition B)

The active energy ray curing composition A composes the region alpha by being cured by irradiation of the active energy ray.

The active energy ray curing composition A can be prepared by blending components as appropriate to compose the region alpha as desired, and includes an active energy ray curing composition, and as necessary, fine particles and other components.

The active energy ray curing composition B composes the region beta by being cured by irradiation of the active energy ray.

The active energy ray curing composition B can be prepared by blending components as appropriate to compose the region beta as desired, and includes an active energy ray curing composition, and as necessary, fine particles and other components.

As the abovementioned "other components", various additives such as a mold release agent, an antistatic agent, a leveling agent, an antifouling property improving agent, a dispersion stabilizer, and a viscosity modifier can be exemplified.

The viscosity of the active energy ray curing composition A is preferably 10 to 3000 mPa·s, more preferably 20 to 2500 mPa·s, and further more preferably 30 to 2000 mPa·s, for superior operability of the optical film during production.

The viscosity of the active energy ray curing composition B is preferably 10 to 3000 mPa·s, more preferably 20 to 2500 mPa·s, and further more preferably 30 to 2000 mPa·s, for followability to the concave shaped surface on the outer peripheral surface of the roll mold 51 and superior operability of the optical film during production.

It should be noted that, in the above description, a method of producing the optical film of the present invention is by curing the active energy curing composition by an active energy ray; however, the optical film of the present invention can be obtained also with a thermosetting composition in place of the active energy ray curing composition, by curing the thermosetting composition by heat in place of the active energy ray.

(Surface Light Emitter)

The surface light emitter of the present invention includes the optical film of the present invention.

As the surface light emitter of the present invention, a surface light emitter as illustrated in FIG. 5 can be exemplified.

The surface light emitter as illustrated in FIG. 5 is described hereinafter; however, the surface light emitter according to the present invention is not limited to the surface light emitter as illustrated in FIG. 5.

In the surface light emitter as illustrated in FIG. 5, the optical film 20 is provided, through an adhesive layer 30, on a surface of a glass substrate 41 of the organic EL light emitting device 40 composed of the glass substrate 41, an anode 42, a light emitting layer 43, and a cathode 44 that are sequentially layered.

The surface light emitter in which the organic EL light emitting device 40 is provided with the optical film 20 of the present invention is superior in light extraction efficiency, and can suppress the output angle dependence of the output light wavelength.

EXAMPLES

The present invention will be described in more detail by way of examples, which are however not intended to limit the present invention.

It should be noted that "part" and "%" used in Examples indicate "part by mass" and "% by mass" respectively.
(Observation of Cross-Section of Optical Film)

The optical films obtained in Examples and Comparative Examples were cut using a razor blade, at an apex of the microlens and vertically with respect to the bottom surface portion of the microlens. The cut planes thus obtained were observed using an electron microscope (model name S-4300-SE/N, manufactured by Hitachi High-Technologies Corporation).
(Measurement of Light Extraction Efficiency of Surface Light Emitter)

A light shielding sheet 0.1 mm in thickness with a hole of 10 mm in diameter was disposed on each of the surface light emitters obtained in Example, Comparative Example, and Reference Example, and a sample thus obtained was disposed at a sample aperture of an integrating sphere (manufactured by Labsphere, Inc., 6 inch in size). In this state, light output from the hole of 10 mm in diameter on the light shielding sheet when the organic EL light emitting device was on with a current of 10 mA was measured by spectroscopic instrument (spectroscope: model name PMA-12 manufactured by Hamamatsu Photonics K.K., software: U6039-01 Version 3.1.0 basic software for PMA) and corrected by the standard luminosity curve, and the photon number of the surface light emitter was calculated.

A ratio (percentage) of the photon number of the surface light emitter obtained in Examples and Comparative Examples with respect to the photon number of the surface light emitter obtained in Reference Example as a standard was obtained as the light extraction efficiency (%).
(Measurement of Amount of Chromatic Variation of Surface Light Emitter)

A light shielding sheet 0.1 mm in thickness with a hole of 10 mm in diameter was disposed on each of the surface light emitters obtained in Example, Comparative Example, and Reference Example. In this state, light output from the hole of 10 mm in diameter on the light shielding sheet when the organic EL light emitting device was on with a current of 1.5 A was measured for chromaticity x, y in xy color system by a luminance meter (mode name BM-7, manufactured by Topcon Corporation) with inclination of 2.5 degrees, respectively, from a normal direction of the surface light emitter. Based on the measured values for x, y between 0 and 80 degrees thus obtained, using the following equations according to the CIE1960UCS chromaticity diagram:

$$U=4x/(-2x+12y+3);$$

$$V=6y/(-2x+12y+3);$$

U, V were calculated, then Δu, Δv, which are respective differences between the minimum value and the maximum value of U, V between 0 and 80 degrees, were calculated, and a greater one of these values was obtained as the amount of chromatic variation.

It should be noted that a smaller amount of chromatic variation means superior suppression of output angle dependence of the output light wavelength of a surface light emitter.
(Materials Used in Example, Comparative Example, and Reference Example)

Resin A: resin obtained by curing an active energy ray curing resin composition (1) (described later) by irradiation of an active energy ray (refractive index 1.52)

Resin B: resin obtained by curing an active energy ray curing resin composition (2) (described later) by irradiation of an active energy ray (refractive index 1.58)

Fine particle A: spherical fine particles of silicone resin (trade name "Tospearl 2000B", manufactured by Momentive Performance Materials, refractive index 1.42, volume average particle size 6 μm)

Fine particle B: spherical fine particles of styrene resin (trade name "SBX-6", manufactured by Sekisui Plastics Co., Ltd., refractive index 1.59, volume average particle size 6 μm)

Fine particle C: spherical fine particles of silicone resin (trade name "TSR9000", manufactured by Momentive Performance Materials, refractive index 1.42, volume average particle size 2 μm)

Organic EL light emitting device: organic EL light emitting device obtained by removing an optical film on a surface of a light emission face of the organic EL lighting panel kit "Symfos OLED-010K" (manufactured by Konica Minolta, Inc.)

Reference Example

The organic EL light emitting device was used as is as the surface light emitter.

Example 1

Production of Active Energy Ray Curing Composition (1)

A glass flask was charged with: 117.6 g (0.7 mol) of hexamethylene diisocyanate and 151.2 g (0.3 mol) of trimer of isocyanurate type hexamethylene diisocyanate as diisocyanate compounds; 128.7 g (0.99 mol) of 2-hydroxypropyl acrylate and 693 g (1.54 mol) of pentaerythritol triacrylate as hydroxyl group-containing (meth)acrylate; 22.1 g of di-n-butyltin dilaurate as catalyst; and 0.55 g of hydroquinone monomethyl ether as polymerization inhibitor, heated up to 75° C., agitated while maintaining the temperature at 75° C., reacted until the concentration of remaining isocyanate compound in the flask became 0.1 mol/L or lower, and cooled down to room temperature, thereby obtaining urethane polyfunctional acrylate.

The active energy ray curing resin composition (1) was obtained by blending: 34.6 parts of the urethane polyfunctional acrylate thus obtained; 24.7 parts of polybutylene glycol dimethacrylate (trade name "Acryester PBOM" manufactured by Mitsubishi Rayon Co., Ltd.); 39.5 parts of ethylene oxide-modified bisphenol A dimethacrylate (trade name "New Frontier BPEM-10", manufactured by Dai-ichi Kogyo Seiyaku Co., Ltd.); and 1.2 parts of 1-hydroxycyclohexyl phenyl ketone (trade name "Irgacure 184", manufactured by Ciba Specialty Chemicals Inc.).

Production of Active Energy Ray Curing Composition (2)

Fluorene-based acrylate (trade name "Ogsol EA-5003", manufactured by Osaka Gas Chemicals Co., Ltd.) was used as is as the active energy ray curing resin composition (2).
(Production of Roll Mold)

An outer peripheral surface of a steel roll, which is 200 mm in outside diameter and 320 mm in length in an axial direction, was plated with copper of 200 µm in thickness and 230 Hv in Vickers hardness. A photosensitizing agent was applied to a copper plate layer, irradiated with laser, developed, and etched, to thereby obtain a mold with a transfer unit, in which semispherical concave shapes of 50 µm in diameter and 25 µm in depth are arranged in a hexagonal alignment with minimal interval of 3 µm, formed on the copper plate layer. A surface of the mold thus obtained was plated with chrome in order to provide rust prevention and durability, to thereby obtain the roll mold.

It should be noted that a width of a region in which the concave shaped transfer unit is present on the roll mold is 280 mm, the region is provided at a center of 320 mm, which is the length of the roll mold in the axial direction, and both ends of the roll mold in the axial direction were made mirror plane regions.
(Production of Optical Film)

Figure 7:
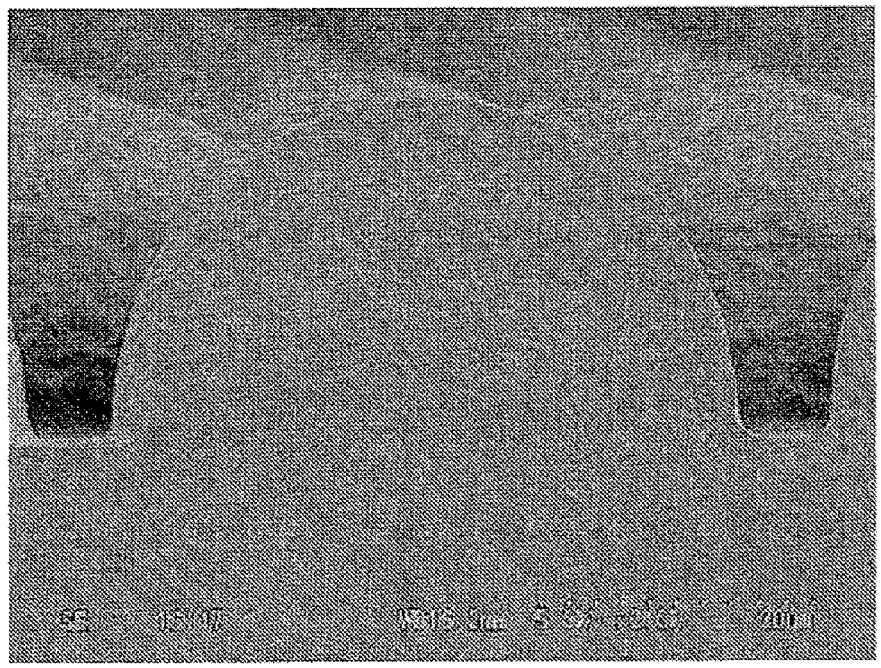
FIG. 7 is an image of a cross-section of an optical film obtained in Example 1 taken by an electron microscope.

Using the active energy ray curing resin composition (2) as the active energy ray curing resin composition A composing the region alpha, and the active energy ray curing resin composition (1) as the active energy ray curing resin composition B composing the region beta, an optical film was produced by performing step A (the application includes making the active energy ray curing composition B follow a surface of the concave microlens transfer unit), step X, step B, step C, and step D in this order, using the device illustrated in FIG. 6. An image of a cross-section of the optical film thus obtained taken by an electron microscope is shown in FIG. 7. In the microlens of the optical film thus obtained, the region alpha was composed of the resin B; the region beta was composed of the resin A; the average maximum diameter $L_{ave}$ of the bottom surface portion of the microlens was 50 µm; the average height $H_{ave}$ of the microlens was 25 µm; and the average height $h_{ave}$ of the region alpha was 18 µm. The microlens had a spherical segment shape approximately corresponding to the size of the concave shape on the roll mold. In addition, the buffer layer of the optical film thus obtained was composed of the same component as the region alpha and was 20 µm in thickness.

It should be noted that, a polyester film (trade name "Diafoil T910E125", manufactured by Mitsubishi Plastics Co., Ltd., 340 mm in width, 125 µm in thickness) was used as the base material 22; the above described roll mold was used as the roll mold 51; a plastic doctor blade (trade name "Maniveil", manufactured by Eco Blade, Inc., 0.35 mm in thickness, with tapered blade edge) was used as the doctor blade 54; an ultraviolet irradiation device (model name "SP-7", manufactured by Ushio Inc.) was used as the active energy ray irradiating device 55; an ultraviolet irradiation device (model name "LightHammer 6", manufactured by Fusion UV Systems Inc.) was used as the active energy ray irradiating device 55'; a rubber roller (trade name "Granpaul UV", manufactured by Miyakawa Roller Co., Ltd., 60 degrees in rubber hardness of surface) was used as the nip roll 56 and the hold-down roll 56'.

In addition, production conditions were as follows.

Travel speed of the base material 22 was 3 m/min; rotation speed of the roll mold was 3 m/min; surface temperature of the roll mold was 40° C.; temperature of the active energy ray curing resin composition A and the active energy ray curing resin composition B was 25° C.; and viscosity of the active energy ray curing resin composition A and the active energy ray curing resin composition B was 700 mPa·s.

As a method of applying the active energy ray curing composition B, a method of pouring the active energy ray curing composition B dropwise onto the roll mold 51 using the nozzle 52, bringing into contact with the doctor blade 54 to thereby form the bank 53, and spreading the active energy ray curing composition B in a width direction of the roll mold 51 was employed. In this application method, the active energy ray curing composition B was made to follow a surface of the concave microlens transfer unit on the outer peripheral surface of the roll mold 51.

As a method of providing the active energy ray curing composition A, a method of pouring the active energy ray curing composition A dropwise using the nozzle 52' onto the roll mold 51 with the active energy ray curing composition B applied thereonto, bringing into contact with the nip roll 56 through the base material 22 to thereby form the bank 53', and spreading the active energy ray curing composition A in the width direction of the roll mold 51 was employed.

An ultraviolet ray of 0.2 J/cm² in accumulated amount was emitted from the active energy ray emitting device 55, and an ultraviolet ray of 0.76 J/cm² in accumulated amount was emitted from the active energy ray emitting device 55'.
(Production of Surface Light Emitter)

The Cargille refractive index liquid (refractive index 1.52, manufactured by Moritex Corporation) as an adhesive layer was applied to a light emission face side of the organic EL light emitting device A, and a base material face of the optical film obtained having the base material was optically adhered thereto, thereby obtaining a surface light emitter. The light extraction efficiency and an amount of chromatic variation of the surface light emitter thus obtained are shown in Table 1.

Comparative Examples 1 to 3

A surface light emitter was obtained by performing a process in a similar manner to Example 1, except for changing the resin composing the region alpha and the region beta of the optical film as shown in Table 1. The light extraction efficiency and an amount of chromatic variation of the surface light emitter thus obtained are shown in Table 1.

TABLE 1

| | Region alpha Resin | | Region beta Resin | | Light Extraction Efficiency (%) | Amount of Chromatic Variation |
|---|---|---|---|---|---|---|
| | Type | Refractive Index | Type | Refractive Index | | |
| Reference Example | — | — | — | — | 100 | 0.022 |
| Example 1 | Resin B | 1.58 | Resin A | 1.52 | 178.9 | 0.012 |

TABLE 1-continued

|  | Region alpha Resin | | Region beta Resin | | Light Extraction Efficiency (%) | Amount of Chromatic Variation |
|---|---|---|---|---|---|---|
|  | Type | Refractive Index | Type | Refractive Index | | |
| Comparative Example 1 | Resin A | 1.52 | Resin A | 1.52 | 178.0 | 0.013 |
| Comparative Example 2 | Resin B | 1.58 | Resin B | 1.58 | 177.0 | 0.013 |
| Comparative Example 3 | Resin A | 1.52 | Resin B | 1.58 | 175.6 | 0.013 |

As can be seen in Table 1, the surface light emitter obtained in Example 1 including the optical film of the present invention was superior in the light extraction efficiency to the surface light emitters obtained in Comparative Examples 1 to 3.

Example 2

A surface light emitter was obtained by performing a process in a similar manner to Example 1, except for employing 100 parts of the active energy ray curing resin composition (1) as the active energy ray curing resin composition A composing the region alpha, and 90 parts of the active energy ray curing resin composition (1) and as well as 10 parts of the fine particle A as the active energy ray curing resin composition B composing the region beta. The light extraction efficiency and an amount of chromatic variation of the surface light emitter thus obtained are shown in Table 2.

Examples 3 to 18, Comparative Examples 4 and 5

Figure 8:
FIG. 8 is an image of a cross-section of an optical film obtained in Example 4 taken by an electron microscope.
Figure 9:
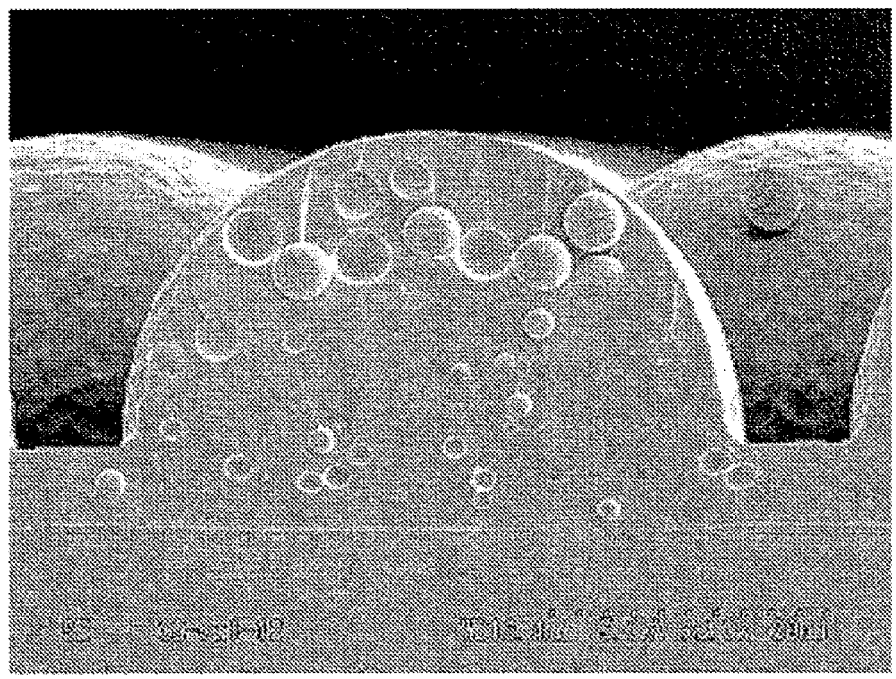
FIG. 9 is an image of a cross-section of an optical film obtained in Example 15 taken by an electron microscope.
Figure 10:
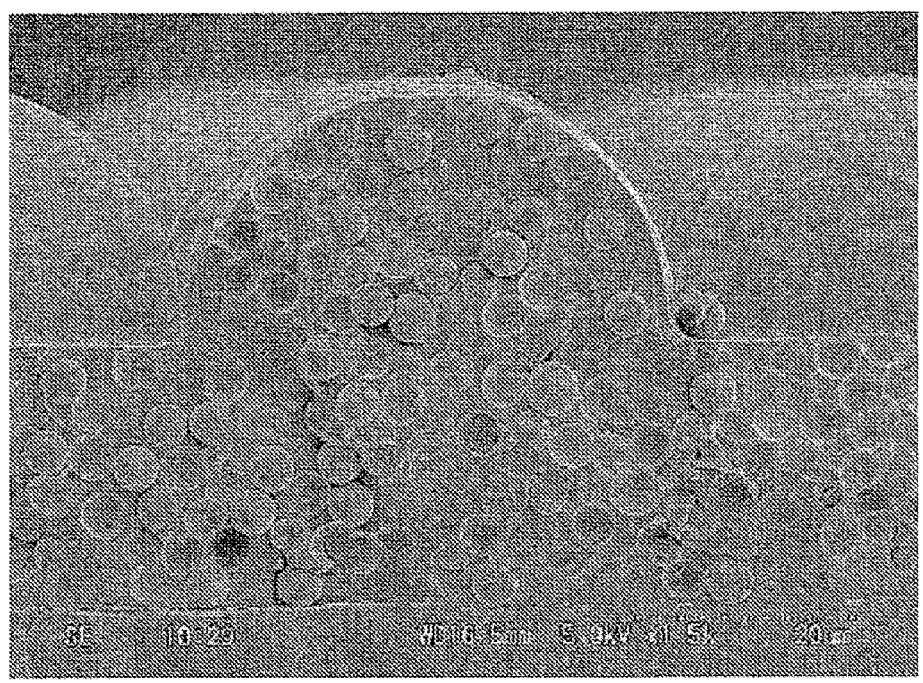
FIG. 10 is an image of a cross-section of an optical film obtained in Comparative Example 4 taken by an electron microscope.

A surface light emitter was obtained by performing a process in a similar manner to Example 2, except for changing the resin and the fine particles composing the region alpha and the region beta of the optical film as shown in Table 2. Images of cross-sections of the optical films obtained in Examples 4, 15, and Comparative Example 4 taken by an electron microscope are shown in FIGS. 8 to 10. The light extraction efficiency and an amount of chromatic variation of the surface light emitter thus obtained are shown in Table 2.

TABLE 2

|  | Region alpha | | | | | | Region beta | | |
|---|---|---|---|---|---|---|---|---|---|
|  | Resin | | | Fine Particles | | | Resin | | |
|  | Type | Refractive Index | Content | Type | Refractive Index | Content | Type | Refractive Index | Content |
| Reference Example | — | — | — | — | — | — | — | — | — |
| Example 2 | Resin A | 1.52 | 100 | — | — | 0 | Resin A | 1.52 | 90 |
| Example 3 | Resin A | 1.52 | 100 | — | — | 0 | Resin A | 1.52 | 80 |
| Example 4 | Resin A | 1.52 | 100 | — | — | 0 | Resin A | 1.52 | 70 |
| Example 5 | Resin A | 1.52 | 100 | — | — | 0 | Resin A | 1.52 | 60 |
| Example 6 | Resin A | 1.52 | 90 | Fine ParticlesA | 1.42 | 10 | Resin A | 1.52 | 70 |
| Example 7 | Resin A | 1.52 | 80 | Fine ParticlesA | 1.42 | 20 | Resin A | 1.52 | 70 |
| Example 8 | Resin A | 1.52 | 100 | — | — | 0 | Resin A | 1.52 | 70 |
| Example 9 | Resin A | 1.52 | 100 | — | — | 0 | Resin A | 1.52 | 90 |
| Example 10 | Resin A | 1.52 | 100 | — | — | 0 | Resin A | 1.52 | 80 |
| Example 11 | Resin A | 1.52 | 100 | — | — | 0 | Resin A | 1.52 | 70 |
| Example 12 | Resin A | 1.52 | 95 | Fine ParticlesC | 1.42 | 5 | Resin A | 1.52 | 70 |
| Example 13 | Resin A | 1.52 | 90 | Fine ParticlesC | 1.42 | 10 | Resin A | 1.52 | 70 |
| Example 14 | Resin A | 1.52 | 95 | Fine ParticlesC | 1.42 | 5 | Resin A | 1.52 | 70 |
| Example 15 | Resin A | 1.52 | 90 | Fine ParticlesC | 1.42 | 10 | Resin A | 1.52 | 70 |
| Example 16 | Resin A | 1.52 | 100 | — | — | 0 | Resin B | 1.58 | 70 |
| Example 17 | Resin B | 1.58 | 100 | — | — | 0 | Resin A | 1.52 | 70 |
| Example 18 | Resin B | 1.58 | 100 | — | — | 0 | Resin A | 1.52 | 70 |
| Comparative Example 1 | Resin A | 1.52 | 100 | — | — | 0 | Resin A | 1.52 | 100 |
| Comparative Example 3 | Resin A | 1.52 | 100 | — | — | 0 | Resin B | 1.58 | 100 |
| Comparative Example 4 | Resin A | 1.52 | 70 | Fine ParticlesA | 1.42 | 30 | Resin A | 1.52 | 70 |
| Comparative Example 5 | Resin A | 1.52 | 70 | Fine ParticlesC | 1.42 | 30 | Resin A | 1.52 | 70 |

|  | Region beta Fine Particles | | | Light Extraction Efficiency | | Amount of Chromatic Variation | |
|---|---|---|---|---|---|---|---|
|  | Type | Refractive Index | Content | Efficiency (%) | Evaluation | Amount of Variation | Evaluation |
| Reference Example | — | — | — | 100 | — | 0.022 | — |

TABLE 2-continued

| | | | | | | | |
|---|---|---|---|---|---|---|---|
| Example 2 | Fine ParticlesA | 1.42 | 10 | 172.1 | B | 0.011 | B |
| Example 3 | Fine ParticlesA | 1.42 | 20 | 172.6 | B | 0.012 | B |
| Example 4 | Fine ParticlesA | 1.42 | 30 | 171.0 | B | 0.011 | B |
| Example 5 | Fine ParticlesA | 1.42 | 40 | 170.9 | B | 0.009 | A |
| Example 6 | Fine ParticlesA | 1.42 | 30 | 172.1 | B | 0.009 | A |
| Example 7 | Fine ParticlesA | 1.42 | 30 | 173.0 | B | 0.008 | A |
| Example 8 | Fine ParticlesB | 1.58 | 30 | 171.9 | B | 0.010 | A |
| Example 9 | Fine ParticlesC | 1.42 | 10 | 172.5 | B | 0.012 | B |
| Example 10 | Fine ParticlesC | 1.42 | 20 | 172.2 | B | 0.010 | A |
| Example 11 | Fine ParticlesC | 1.42 | 30 | 172.0 | B | 0.008 | A |
| Example 12 | Fine ParticlesC | 1.42 | 30 | 171.4 | B | 0.005 | A |
| Example 13 | Fine ParticlesC | 1.42 | 30 | 170.6 | B | 0.003 | A |
| Example 14 | Fine ParticlesC | 1.42 | 30 | 170.6 | B | 0.007 | A |
| Example 15 | Fine ParticlesA | 1.42 | 30 | 170.7 | B | 0.005 | A |
| Example 16 | Fine ParticlesA | 1.42 | 30 | 175.8 | A | 0.006 | A |
| Example 17 | Fine ParticlesA | 1.42 | 30 | 175.2 | A | 0.005 | A |
| Example 18 | Fine ParticlesC | 1.42 | 30 | 174.4 | A | 0.005 | A |
| Comparative Example 1 | — | — | 0 | 178.0 | A | 0.013 | C |
| Comparative Example 3 | — | — | 0 | 175.6 | A | 0.013 | C |
| Comparative Example 4 | Fine ParticlesA | 1.42 | 30 | 170.5 | C | 0.003 | A |
| Comparative Example 5 | Fine ParticlesC | 1.42 | 30 | 170.3 | C | 0.003 | A |

Evaluation standards for the light extraction efficiency shown in Table 2 are presented below.
A: higher than 174.0
B: higher than 170.5 and no higher than 174.0
C: no higher than 170.5

Evaluation standards for the amount of chromatic variation shown in Table 2 are presented below.
A: no higher than 0.010
B: higher than 0.010 and no higher than 0.012
C: higher than 0.012

As can be seen from Table 2, the surface light emitters obtained in Examples 2 to 18 including the optical film of the present invention were superior in light extraction efficiency, and superior in suppressing the output angle dependence of the output light wavelength. The surface light emitters obtained in Examples 16 to 18 were particularly superior both in light extraction efficiency and superior in suppressing the output angle dependence of the output light wavelength.

On the other hand, the surface light emitters obtained in Comparative Examples 1 and 3 were superior in light extraction efficiency, but poor in suppressing the output angle dependence of the output light wavelength, since no fine particle was included in the region beta. In addition, the surface light emitters obtained in Comparative Examples 4 and 5 were superior in suppressing the output angle dependence of the output light wavelength, but poor in light extraction efficiency, since the content of fine particle in the region alpha was not lower than the content of fine particle in the region beta.

Examples 19 to 21

Figure 11:
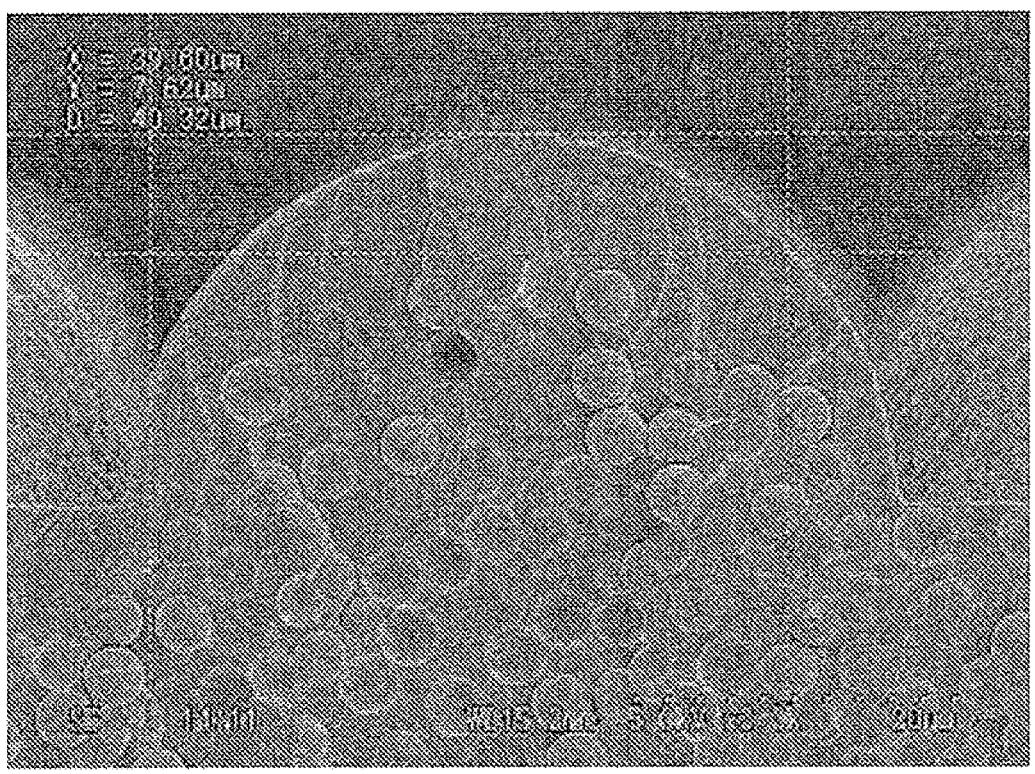
FIG. 11 is an image of a cross-section of an optical film obtained in Example 21 taken by an electron microscope.

A surface light emitter was obtained by performing a process in a similar manner to Example 2, except for changing the resin and the fine particles composing the region alpha and the region beta of the optical film as shown in Table 3. An image of a cross-section of the optical film obtained in Example 21 taken by an electron microscope is shown in FIG. 11. For the surface light emitters thus obtained, the optical film thereof was scratched by making a piece of waste cloth reciprocate for 1000 times in a distance of 100 mm at a speed of 30 rounds/min using a gakushin-type rubbing tester (model name "RT-200", manufactured by Daiei Kagaku Seiki Mfg. Co., Ltd.) under conditions of a load of 2 N and a curved surface friction block. The light extraction efficiency of the surface light emitters obtained before and after a flaw resistance evaluation is shown in Table 3.

TABLE 3

| | Region alpha | | | | | | Region beta | | |
|---|---|---|---|---|---|---|---|---|---|
| | Resin | | | Fine Particles | | | Resin | | |
| | Type | Refractive Index | Content | Type | Refractive Index | Content | Type | Refractive Index | Content |
| Reference Example | — | — | — | — | — | — | — | — | — |
| Example 19 | Resin A | 1.52 | 90 | Fine Particles A | 1.42 | 10 | Resin A | 1.52 | 100 |
| Example 20 | Resin A | 1.52 | 80 | Fine Particles A | 1.42 | 20 | Resin A | 1.52 | 100 |
| Example 21 | Resin A | 1.52 | 70 | Fine Particles A | 1.42 | 30 | Resin A | 1.52 | 100 |
| Comparative Example 1 | Resin A | 1.52 | 100 | — | — | 0 | Resin A | 1.52 | 100 |
| Comparative Example 4 | Resin A | 1.52 | 70 | Fine Particles A | 1.42 | 30 | Resin A | 1.52 | 70 |

TABLE 3-continued

|  | Region beta | | | Light Extraction Efficiency | | |
|---|---|---|---|---|---|---|
|  | Fine Particles | | | Before Flaw | After Flaw | |
|  | Type | Refractive Index | Content | Resistance Evaluation | Resistance Evaluation | Difference |
| Reference Example | — | — | — | 100 | — | — |
| Example 19 | — | — | 0 | 175.2 | 175.2 | 0.0 |
| Example 20 | — | — | 0 | 174.9 | 174.9 | 0.0 |
| Example 21 | — | — | 0 | 175.0 | 174.4 | −0.6 |
| Comparative Example 1 | — | — | 0 | 178.0 | 176.7 | −1.3 |
| Comparative Example 4 | Fine Particles A | 1.42 | 30 | 170.5 | 168.5 | −2.0 |

As can be seen from Table 3, the optical films of the present invention obtained in Examples 19 to 21 showed only a small difference of the light extraction efficiency between before and after the flaw resistance evaluation of the surface light emitters, and therefore were superior to the optical films obtained in Comparative Examples 1 and 4 in flaw resistance.

Example 22

An optical film was obtained by performing a process in a similar manner to Example 1 except for changing the method of applying the active energy ray curing composition B from the method of pouring the active energy ray curing composition B dropwise onto the roll mold 51 using the nozzle 52, bringing into contact with the doctor blade 54 to thereby form the bank 53, and spreading the active energy ray curing composition B in a width direction of the roll mold 51 to the method of applying by pouring the active energy ray curing composition B dropwise onto the doctor blade 54, bringing the active energy ray curing composition B along the doctor blade 54 to the outer peripheral surface of the roll mold 51 to thereby form a bank 53, and spreading the active energy ray curing composition B in a width direction of the roll mold 51 (application including making the active energy ray curing composition B follow a surface of the concave microlens transfer unit). The optical film thus obtained did not have an air bubble generated in microlenses, and had uniform microlenses transferred thereto.

Example 23

An optical film was obtained by performing a process in a similar manner to Example 22 except for changing the doctor blade 54 to a roll coater (application includes making the active energy ray curing composition B follow a surface of the concave microlens transfer unit). The optical film thus obtained did not have an air bubble generated in microlenses, and had uniform microlenses transferred thereto.

INDUSTRIAL APPLICABILITY

The optical film of the present invention can provide a surface light emitter superior in light extraction efficiency, or superior in suppressing the output angle dependence of the output light wavelength, and the surface light emitter can preferably be used as a lighting device, a display, a screen, and the like.

EXPLANATION OF REFERENCE NUMERALS

10 Microlens
11 Region alpha
12 Region beta
13 Bottom surface portion
20 Optical film
21 Buffer layer
22 Base material
30 Adhesive layer
40 Organic EL light emitting device
41 Glass substrate
42 Anode
43 Light emitting layer
44 Cathode
50 Manufacturing apparatus of optical film
51 Roll mold
52 Nozzle
52' Nozzle
53 Bank
53' Bank
54 Doctor blade
55 Active energy ray emitting device
55' Active energy ray emitting device
56 Nip roll
56' Hold-down roll

The invention claimed is:
1. A method for producing an optical film provided with a plurality of aligned convex microlenses comprising the following steps A to D that are sequentially performed:
   step A: a step of rotating a roll mold having an outer peripheral surface provided with a plurality of aligned concave microlens transfer units, applying an active energy ray curing composition B onto the outer peripheral surface of the roll mold while making a base material travel in a rotational direction of the roll mold along the outer peripheral surface of the roll mold, and filling a part of a concave shape of the microlens transfer units with the active energy ray curing composition B;
   step X: a step of irradiating the active energy ray curing composition B with an active energy ray;
   step B: a step of providing an active energy ray curing composition A to between the outer peripheral surface of the roll mold and the base material;
   step C: a step of irradiating a region between the outer peripheral surface of the roll mold and the base material with an active energy ray, in a state in which the active energy ray curing composition A is interposed between the outer peripheral surface of the roll mold and the base material; and step D: a step of separating a cured product obtained in the step C from the roll mold.

2. The method for producing an optical film according to claim 1, wherein application of the active energy ray curing composition B in the step A is application for making the active energy ray curing composition B follow a surface of the concave microlens transfer unit on the outer peripheral surface of the roll mold.

* * * * *